United States Patent
Furuha et al.

(10) Patent No.: US 12,439,751 B2
(45) Date of Patent: Oct. 7, 2025

(54) LIGHT EMITTING ELEMENT AND LIGHT EMITTING DEVICE

(71) Applicant: NICHIA CORPORATION, Anan (JP)

(72) Inventors: Naoto Furuha, Tokushima (JP); Hiroki Fukuta, Anan (JP)

(73) Assignee: NICHIA CORPORATION, Anan (JP)

( * ) Notice: Subject to any disclaimer, the term of this patent is extended or adjusted under 35 U.S.C. 154(b) by 745 days.

(21) Appl. No.: 17/592,416

(22) Filed: Feb. 3, 2022

(65) Prior Publication Data

US 2022/0246815 A1 Aug. 4, 2022

(30) Foreign Application Priority Data

Feb. 4, 2021 (JP) .................................. 2021-016363
Dec. 6, 2021 (JP) .................................. 2021-197641

(51) Int. Cl.
*H10H 20/857* (2025.01)
*H10H 20/831* (2025.01)

(52) U.S. Cl.
CPC ...... *H10H 20/857* (2025.01); *H10H 20/8312* (2025.01)

(58) Field of Classification Search
None
See application file for complete search history.

(56) References Cited

U.S. PATENT DOCUMENTS

| | | | | |
|---|---|---|---|---|
| 11,417,811 B2 * | 8/2022 | Takenaga | | H01L 33/382 |
| 2010/0117111 A1 | 5/2010 | Illek et al. | | |
| 2018/0182929 A1 | 6/2018 | Ozeki et al. | | |
| 2018/0294391 A1 | 10/2018 | Emura | | |
| 2019/0097086 A1 * | 3/2019 | Shichijo | | H01L 33/10 |
| 2019/0148325 A1 * | 5/2019 | Lu | | H01L 24/05 257/737 |
| 2019/0267529 A1 * | 8/2019 | Nakai | | H01L 33/38 |
| 2020/0212278 A1 | 7/2020 | Takenaga et al. | | |
| 2022/0254960 A1 * | 8/2022 | Furuha | | H01L 33/647 |

FOREIGN PATENT DOCUMENTS

| | | |
|---|---|---|
| JP | 2010-525586 A | 7/2010 |
| JP | 2018-107371 A | 7/2018 |
| JP | 2018-181942 A | 11/2018 |
| JP | 2019-153777 A | 9/2019 |
| JP | 2020-107819 A | 7/2020 |
| JP | 2020-178017 A | 10/2020 |

* cited by examiner

*Primary Examiner* — Yara B Green
*Assistant Examiner* — Seth D Lawson
(74) *Attorney, Agent, or Firm* — Global IP Counselors, LLP

(57) ABSTRACT

A light emitting element includes a semiconductor layered body, an insulating film, first and second electrodes, and first and second external connection portions. The semiconductor layered body defines exposed portions in which the first semiconductor layer is exposed from the second semiconductor layer and the light emitting layer. In the plan view, the first external connection portion includes a plurality of first portions located between the exposed portions in a first direction, and arrayed in the first direction, with a number of the first portions disposed between adjacent ones of the exposed portions being two or more, and a plurality of second portions not located between the exposed portions in the first direction, and arrayed in the first direction. Each of the second portions is different in shape or size from each of the first portions.

17 Claims, 11 Drawing Sheets

LIGHT EMITTING ELEMENT AND LIGHT EMITTING DEVICE

CROSS-REFERENCE TO RELATED APPLICATION

This application claims priority to Japanese Patent Application No. 2021-016363, filed on Feb. 4, 2021, and Japanese Patent Application No. 2021-197641, filed on Dec. 6, 2021, the disclosures of which are hereby incorporated by reference in their entireties.

BACKGROUND

The present disclosure relates to a light emitting element and a light emitting device.

In known art, a light emitting element has been proposed that includes a semiconductor structure including an n-type semiconductor layer and a light emitting layer and a p-type semiconductor layer that are layered so as to expose a portion of the n-type semiconductor layer, an insulating film including a plurality of opening portions provided in the semiconductor structure, an n-electrode connected through an opening portion, of the plurality of opening portions, provided in the n-type semiconductor layer exposed from the light emitting layer and the p-type semiconductor layer, a p-electrode connected through an opening portion, of the plurality of opening portions, provided in the p-type semiconductor layer, a p-side external connection portion connected to the p-electrode, and an n-side external connection portion connected to the n-electrode (Japanese Translation of PCT International Application Publication No. JP2010-525586T, for example).

SUMMARY

In such a light emitting element, in order to improve heat dissipation performance, it is preferable to increase the area over which the n-side external connection portion and the p-side external connection portion are disposed. On the other hand, when the light emitting element, in which the n-side external connection portion and the p-side external connection portion having the large area are disposed, is bonded to a substrate, it becomes necessary to increase an external force to be applied, and there is a risk that the insulating film and the electrodes may be damaged. Further, in consideration of the spread of a bonding material at the time of bonding, it is necessary to separate the n-side external connection portion from the p-side external connection portion. As a result of these factors, enlargement of the area of the external connection portion itself that can improve the heat dissipation performance is not sufficiently achieved.

The present disclosure has been made in light of such problems, and an object of the present disclosure is to provide a light emitting element and a light emitting device that can suppress an occurrence of damage to an insulating film, an electrode, and the like at a time of bonding, while improving heat dissipation performance.

The present disclosure includes the following aspects.
(1) A light emitting element includes a semiconductor layered body, an insulating film, a first electrode, a second electrode, a first external connection portion, and a second external connection portion. The semiconductor layered body has a rectangular planar shape and includes a first semiconductor layer, a light emitting layer, and a second semiconductor layer in this order. The semiconductor layered body defines a plurality of exposed portions in which the first semiconductor layer is exposed from the second semiconductor layer and the light emitting layer. Each of the exposed portions is surrounded by the second semiconductor layer in a plan view. The insulating film covers the semiconductor layered body, and defines a plurality of opening portions respectively above the exposed portions. The first electrode is connected to the exposed portions at the opening portions. A portion of the first electrode is disposed on the second semiconductor layer via the insulating film. A second electrode is connected to the second semiconductor layer. The first external connection portion is connected to the first electrode and spaced apart from the exposed portions in the plan view. The second external connection portion is connected to the second electrode. In the plan view, the first external connection portion includes a plurality of first portions located between the exposed portions in a first direction parallel to one side of the semiconductor layered body, and arrayed in the first direction, with a number of the first portions disposed between adjacent ones of the exposed portions being two or more, and a plurality of second portions not located between the exposed portions in the first direction, and arrayed in the first direction. Each of the second portions is different in shape or size from each of the first portions.
(2) A light emitting device includes a substrate including a plurality of wires on an upper surface thereof, the light emitting element as described above that is flip-chip mounted on the plurality of wires via the first external connection portion and the second external connection portion, and a cover member containing a light reflective substance and covering the light emitting element, the first external connection portion, the second external connection portion, and the substrate.

According to a light emitting element and a light emitting device according to certain embodiments of the present disclosure, it is possible to suppress an occurrence of damage to an insulating film, an electrode, and the like at a time of bonding while improving heat dissipation performance.

DETAILED DESCRIPTION

Figure 1A:
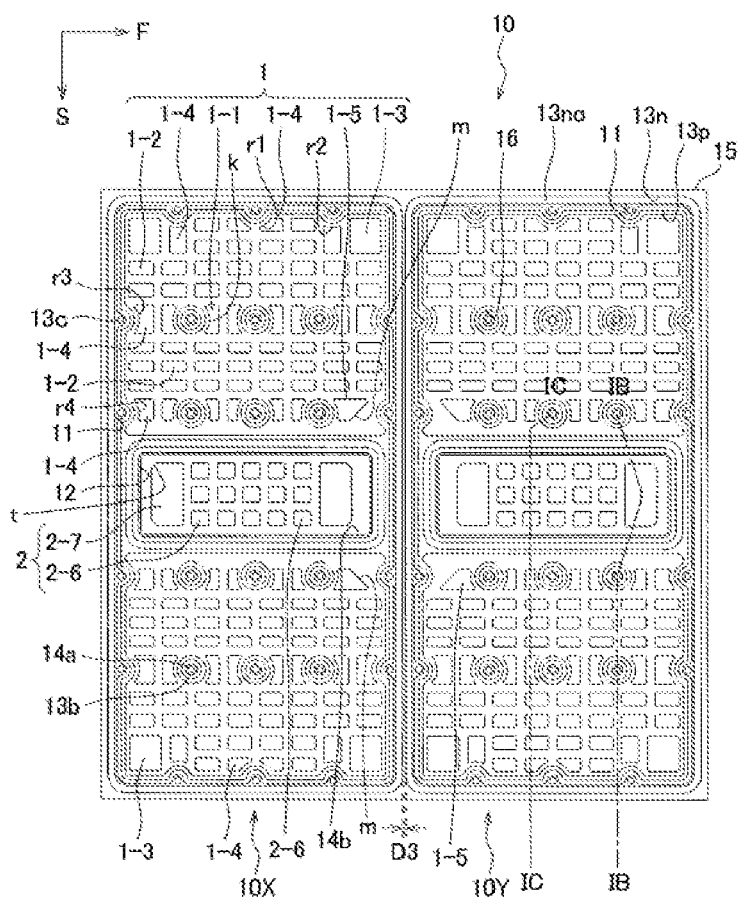
FIG. 1A is a plan view schematically illustrating a light emitting element according to a first embodiment of the present disclosure.

Note that the drawings referred to in the following description are diagrams that schematically illustrate embodiments, and thus scales and intervals of members, positional relationships, and the like are exaggerated, or some of the members may not be illustrated in the drawings. Further, the scales and intervals of the members may not be the same between a plan view and a cross-sectional view thereof. Further, in the following description, members having the same designations and reference signs, in principle, represent the same members or equivalent members, and a detailed description of such members may be omitted as appropriate. In the present specification and the drawings, a first direction refers to a direction parallel to one side of a semiconductor layered body, and includes both a direction indicated by an arrow F and the opposite direction thereof. Similarly, a second direction refers to a direction orthogonal to the first direction, and includes both a direction indicated by an arrow S and the opposite direction thereof.

Light Emitting Element 10

Figure 1B:
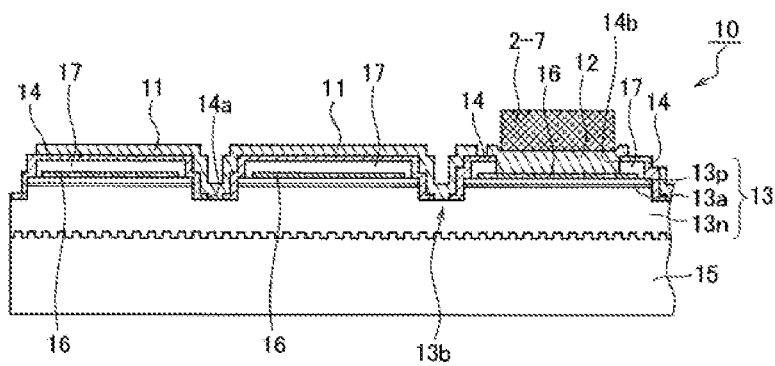
FIG. 1B is a cross-sectional view taken along a line 1B-1B in FIG. 1A.
Figure 1C:
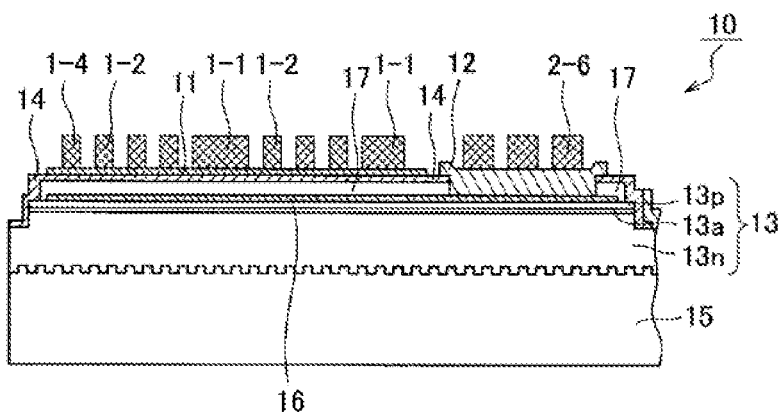
FIG. 1C is a cross-sectional view taken along a line 1C-1C in FIG. 1A.

For example, as illustrated in FIGS. 1A to 1C, a light emitting element 10 according to an embodiment of the present disclosure includes a semiconductor layered body 13 that includes a first semiconductor layer 13n, a light emitting layer 13a, and a second semiconductor layer 13p in this order, and further includes a plurality of exposed portions 13b in which the first semiconductor layer 13n is exposed from the second semiconductor layer 3p and the light emitting layer 13a. The light emitting element 10 covers the semiconductor layered body 13, and includes an insulating film 14 including opening portions 14a above the plurality of exposed portions 13b, and a first electrode 11 connected to the exposed portions 13b at the opening portions 14a, a portion of the first electrode 11 being disposed on the second semiconductor layer 13p via the insulating film 14. The light emitting element 10 includes a second electrode 12 connected to the second semiconductor layer 13p, first external connection portions 1 connected to the first electrode 11 and spaced apart from the exposed portions 13b in a plan view, and second external connection portions 2 connected to the second electrode 12.

The semiconductor layered body 13 has a rectangular planar shape. The exposed portions 13b are arrayed so as to be exposed on the upper surface side of the second semiconductor layer 13p, and are surrounded by the second semiconductor layer 13p in a plan view. The first external connection portions 1 include first portions 1-1 and second portions 1-2. The first portions 1-1 are positioned between the exposed portions 13b adjacent to each other in the first direction F parallel to one side of the semiconductor layered body 13, and a plurality of the first portions 1-1 are arrayed in the first direction F. In other words, the plurality of first portions 1-1 are disposed between the exposed portions 13b so that the first portions 1-1 overlap the exposed portions 13b when viewed along the first direction F. The first portions 1-1 are spaced apart from each other. The second portion 1-2 is not positioned between the exposed portions 13b in the first direction F. In other words, the second portions 1-2 do not overlap the exposed portions 13b when viewed along the first direction F. The second portion 1-2 has a planar shape that is different in shape or size from that of the first portion 1-1, and a plurality of the second portions 1-2 are arrayed in the first direction F.

The light emitting element 10 as described above has a structure suitable for flip-chip mounting in which a surface, of the light emitting element 10, provided with the first electrode 11 and the second electrode 12, and the first external connection portions 1 and the second external connection portions 2 is used as a mounting surface. In the light emitting element 10, a surface on the opposite side of the mounting surface serves as a main light extraction surface.

As will be described below, with the light emitting element 10, since the planar area of a plurality of portions corresponding to the first external connection portions 1 is extremely small compared to the planar area of the light emitting element 10, the plurality of portions can be disposed in a dense manner. As a result, the total planar area of the first external connection portions 1 can be increased, and heat dissipation performance can be improved when the light emitting element 10 is bonded to wires on a substrate. Further, by disposing a plurality of the first external connection portions 1 having the small planar area, an external force applied when bonding the light emitting element 10 to the wires on the substrate can be reduced, and it is thus possible to suppress damage to the insulating film 14 and the electrodes in the vicinity of the exposed portions 13b. As a result, it is possible to improve a bonding performance while maintaining reliability of the light emitting element 10. Furthermore, the plurality of first external connection portions 1 (two or more) are disposed between adjacent ones of the exposed portions 13b, and the plurality of first external connection portions 1 disposed between adjacent ones of the exposed portions 13b are spaced apart from each other. Therefore, in a light emitting device to be described below, with respect to the light emitting element 10 that has been flip-chip mounted on a substrate 23, when an uncured resin material containing a light reflective substance, which forms the resin member 32, is poured between the light emitting element 10 and the substrate 23, the resin member 32 is easily disposed directly below the adjacent exposed portions 13b. As a result, light traveling from the light emitting element 10 toward the substrate 23 can be reflected by the resin member 32 toward the light emitting element 10 side, so the light extraction efficiency of the light emitting device can be improved.

Semiconductor Layered Body 13

The semiconductor layered body 13 is constituted by the first semiconductor layer 13n, the light emitting layer 13a, and the second semiconductor layer 13p that are layered in this order. The semiconductor layered body 13 as described above is typically formed on a support substrate 15 having insulation properties, such as a sapphire substrate, for example. However, the support substrate 15 may finally be removed from the light emitting element 10.

Examples of the semiconductor layered body 13 include various semiconductors, such as an III-V compound semiconductor and an II-VI compound semiconductor. Specifically, the examples include a nitride-based semiconductor material such as $In_XAl_YGa_{1-X-Y}N$ ($0 \leq X$, $0 \leq Y$, $X+Y \leq 1$), and InN, AlN, GaN, InGaN, AlGaN, InGaAlN, and the like can be used. With respect to the film thickness of each of the layers and the layer structure, a film thickness and a layer structure known in this field can be employed.

The planar shape of the semiconductor layered body 13 may be a quadrangular shape or a quadrangular shape of which a part is missing, for example, and it is preferably a rectangular shape (a square, a rectangle, and the like). It is more preferable that the semiconductor layered body 13 have a rectangular shape that is short in the first direction F.

In a plan view, the semiconductor layered body 13 may further include an outer peripheral portion (13no in FIG. 1A) in which the first semiconductor layer 13n is exposed from the second semiconductor layer 13p and the light emitting layer 13a, over the entire outer periphery or a part of the outer periphery of the second semiconductor layer 13p.

Figure 4:
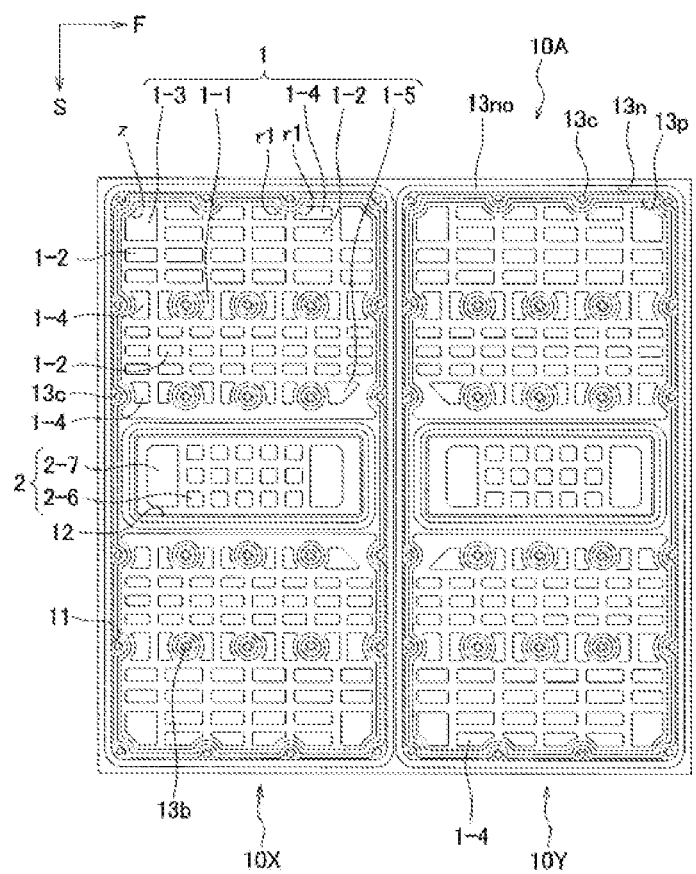
FIG. 4 is a plan view schematically illustrating a light emitting element according to a second embodiment of the present disclosure.
Figure 5:
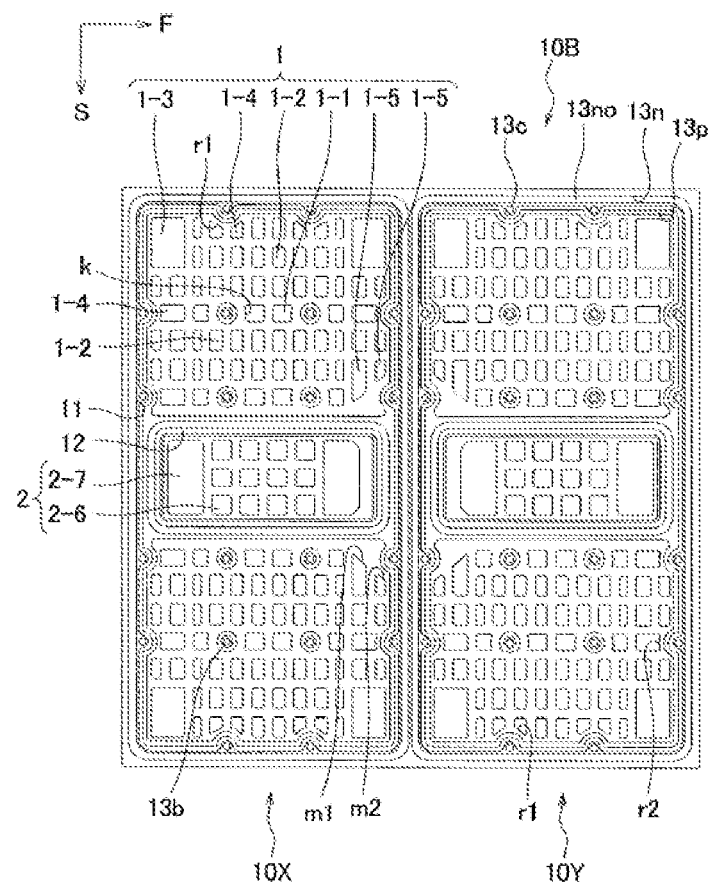
FIG. 5 is a plan view schematically illustrating a light emitting element according to a third embodiment of the present disclosure.
Figure 6:
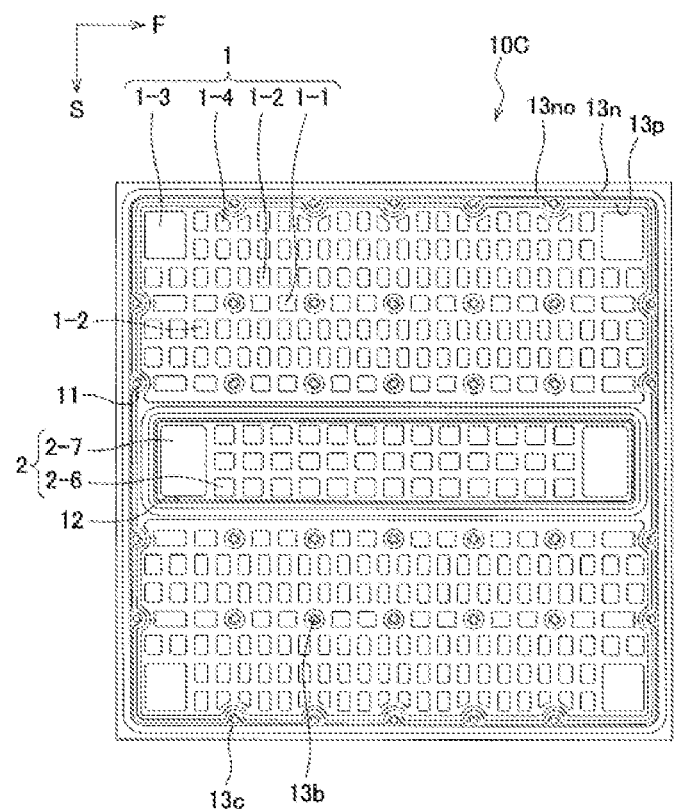
FIG. 6 is a plan view schematically illustrating a light emitting element according to a fourth embodiment of the present disclosure.
Figure 7:
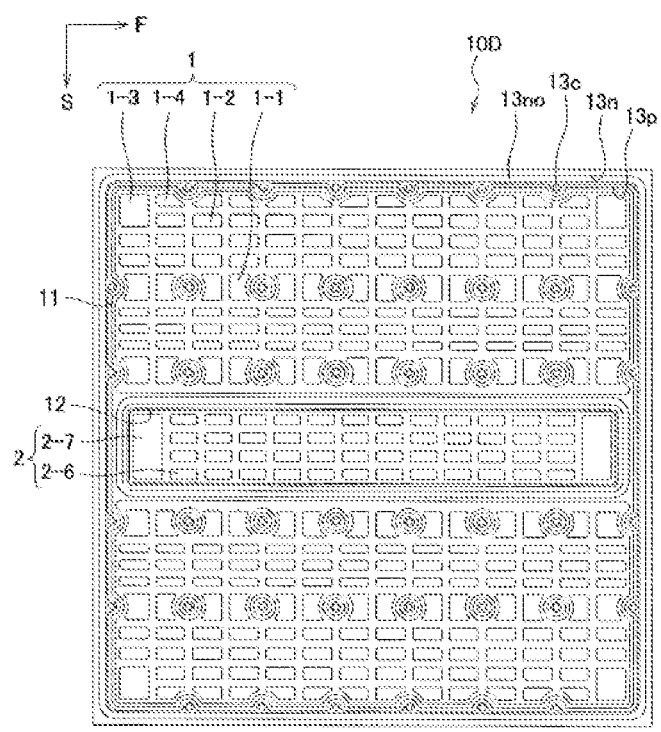
FIG. 7 is a plan view schematically illustrating a light emitting element according to a fifth embodiment of the present disclosure.

One semiconductor layered body 13, for example, as illustrated in FIGS. 6 and 7, may be disposed on one support substrate 15 in one light emitting element 10. As illustrated in FIGS. 1A, 4, and 5, one light emitting element 10 may include two or more light emitting portions in which at least the light emitting layer 13a and the second semiconductor layer 13p are spaced apart from each other. Hereinafter, the semiconductor layered body 13 constituting two or more of the light emitting portions spaced apart from each other in one light emitting element 10 may be referred to as a first light emitting portion, a second light emitting portion, and the like, respectively (see 10X and 10Y in FIG. 1A). The planar shape of the first light emitting portion and the second light emitting portion may be a quadrangular shape, and is preferably a rectangular shape. Of those, the planar shape of the first light emitting portion and the second light emitting portion is more preferably a rectangular shape having short sides along the first direction F. A first light emitting portion 10X and a second light emitting portion 10Y are preferably disposed in close proximity to each other. In FIG. 1A, the shortest distance between the first light emitting portion 10X and the second light emitting portion 10Y, which is indicated by a distance D3, is 30 μm or less, for example. Note that even between the light emitting portions, the outer peripheral portion 13no in which the first semiconductor layer 13n is exposed from the second semiconductor layer 13p and the light emitting layer 13a is provided.

Exposed Portion 13b

The light emitting layer 13a, and the second semiconductor layer 13p provided on the upper surface of the light emitting layer 13a are provided in predetermined regions of the upper surface of the first semiconductor layer 13n. In other words, in some regions on the first semiconductor layer 13n, the second semiconductor layer 13p and the light emitting layer 13a are not present. In this way, a region in which the first semiconductor layer 13n is exposed from the light emitting layer 13a and the second semiconductor layer 13p and which is surrounded by the second semiconductor layer 13p in a plan view is referred to as the exposed portion 13b. In other words, the semiconductor layered body 13 has holes penetrating through the second semiconductor layer 13p and the light emitting layer 13a. In a plan view, a plurality of the holes provided in the semiconductor layered body 13 are spaced apart from each other. The side surfaces of the holes provided in the semiconductor layered body 13 include the side surfaces of the first semiconductor layer 13n, the side surfaces of the second semiconductor layer 13p, and the side surfaces of the light emitting layer 13a. Further, a portion of the first semiconductor layer 13n may be exposed from the side surfaces of the holes provided in the semiconductor layered body 13.

The shape, size, position, and the number of the exposed portions 13b can be set appropriately in accordance with the size, shape, electrode shape, and the like of an intended light emitting element.

Examples of the shape of the exposed portion 13b in a plan view include a circular or elliptical shape, polygonal shapes such a triangular shape, a quadrangular shape, and a hexagonal shape, and of those, the circular shape is preferable. The plurality of exposed portions 13b may each have substantially the same planar shape and approximately the same size, or all or some of the exposed portions 13b may have planar shapes and sizes that are different from each other. By regularly aligning and disposing the plurality of exposed portions 13b of approximately the same size, a bias in current density distribution can be suppressed. As a result, luminance unevenness can be suppressed in the light emitting element as a whole.

The size of the exposed portion 13b can be set appropriately in accordance with the size of the semiconductor layered body, required output, luminance, and the like of the light emitting element, and the like. In a plan view, the exposed portion 13b preferably has a size having a diameter of 5 μm to 30 μm, for example. From another perspective, in a plan view, the diameter of the exposed portion 13b is preferably from 0.5% to 3% of one side of the semiconductor layered body 13. A distance between the exposed portions 13b adjacent to each other may be from 1/15 to 1/4 of the one side of the semiconductor layered body 13. The distance between the adjacent exposed portions 13b is preferably greater than the diameter of the exposed portion 13b. The distance between the adjacent exposed portions 13b may be the same for all of the adjacent exposed portions 13b, or may be different for some or all of the adjacent exposed portions 13b. From the perspective of suppressing the bias in the current density distribution, the distance between the adjacent exposed portions 13b is preferably substantially the same for all of the adjacent exposed portions 13b. Note that the distance between the adjacent exposed portions 13b is a distance between the centers of the exposed portions 13b in a plan view. In particular, it is preferable that the exposed portion 13b have a substantially circular shape in a plan view, the diameter thereof be from 5 μm to 30 μm, for example, and the exposed portions 13b be disposed on the upper surface side at a constant interval, for example, at an interval of 1.5 times to 6 times the diameter of the exposed portion 13b.

The exposed portions 13b are preferably disposed regularly in one light emitting element, and a plurality of the exposed portions 13b are preferably disposed in a matrix pattern, for example. As a result, the bias in the current density distribution in the light emitting element can be suppressed, and thus the luminance unevenness can be suppressed. Specifically, it is preferable that the exposed portions 13b be disposed regularly in a plurality of columns along the first direction F. Here, the first direction F refers to a direction parallel to one side of the semiconductor layered body 13. For example, the plurality of exposed portions 13b are preferably disposed in two or more columns along the first direction F. Further, the exposed portions 13b are preferably also disposed in a plurality of rows in the second direction S that is orthogonal to the first direction F. For example, the plurality of exposed portions 13b are preferably disposed in two rows to 15 rows in the second direction S. As a result of arraying the plurality of exposed portions 13b in the first direction F and the second direction S, respectively, the first external connection portions 1, which will be described below, can be spaced apart from each other between the rows and columns of the exposed portions 13b arrayed along the first direction F and the second direction S.

The number of exposed portions 13b arrayed along the first direction F is preferably two or more, and may be three or more, five or more, or seven or more. The number of exposed portions 13b aligned in the second direction S may be less than or greater than the number of exposed portions 13b aligned in the first direction F. The number of exposed portions 13b aligned in the second direction S is preferably greater than the number of exposed portions 13b aligned in the first direction F.

In a plan view, the exposed portions 13b arrayed along the first direction F preferably include a column adjacent to the second electrode 12, which will be described below. The first external connection portion 1 is not disposed between the column, of the exposed portions 13b, adjacent to the second electrode 12 and the second electrode 12.

A plurality of the exposed portions 13b are preferably disposed inside the semiconductor layered body 13. In a plan view, the total planar area of the exposed portions 13b disposed inside the outer edge of the semiconductor layered body 13 is preferably 30% or less, 25% or less, 20% or less, 18% or less, 15% or less, or 10% or less of the area of the semiconductor layered body 13. By having such a range, the luminance unevenness caused by the bias in the current density distribution in the semiconductor layered body 13 can be suppressed while securing the area of the light emitting layer 13a.

Further, the first semiconductor layer 13n may further include an outer peripheral exposed portion 13c in which the first semiconductor layer 13n is exposed from the second semiconductor layer 3p and the light emitting layer 13a, at the outer periphery of the second semiconductor layer 13p in a plan view. As described above, when the outer peripheral portion 13no that exposes the first semiconductor layer 13n is provided at the outer periphery of the semiconductor layered body 13, the outer peripheral exposed portion 13c may be disposed as part of the outer peripheral portion 13no. Further, when the semiconductor layered body 13 constitutes the plurality of light emitting portions, the outer peripheral exposed portion 13c may also be disposed between the light emitting portions.

The exposed portions 13b and the outer peripheral exposed portions 13c are preferably disposed symmetrically with respect to a bisector bisecting the area of the semiconductor layered body 13 or the area of the light emitting portion in the first direction F or the second direction S.
Insulating Film 14

The insulating film 14 covers the upper and side surfaces of the semiconductor layered body 13. Further, the insulating film 14 has the opening portions 14a above the plurality of exposed portions 13b. Furthermore, the insulating film 14 has opening portions 14b above the second semiconductor layer 13p. The insulating film 14 is provided to prevent the first electrode 11 and the second semiconductor layer 13p, or the second electrode 12 and the first semiconductor layer 13n from being electrically connected to each other. Since the insulating film 14 covers the upper surface of the semiconductor layered body 13 and has the opening portions 14a above the exposed portions 13b, the first electrode 11 can be formed over a wide range of the upper surface of the insulating film 14 covering the upper surface of the second semiconductor layer 13p.

The insulating film 14 is preferably formed of a material and with a thickness that can ensure electrical insulation properties, using a material known in this field. Specifically, the insulating film 14 can be formed of a metal oxide, a metal nitride, or the like, and for example, can be formed of at least one type of an oxide or a nitride selected from a group consisting of Si, Ti, Zr, Nb, Ta, and Al. It is sufficient that the insulating film 14 be a film having a film thickness that can ensure the insulation properties.
First Electrode 11 and Second Electrode 12

The first electrode 11 and the second electrode 12 are disposed on the upper surface side of the semiconductor layered body 13.

The first electrode 11 is connected to the exposed portions 13b at the opening portions 14a of the insulating film 14 above the exposed portions 13b. In this case, the first electrode 11 preferably covers the plurality of exposed portions 13b and is connected to each of the plurality of exposed portions 13b, and the first electrode 11 more preferably covers all of the exposed portions 13b, and is connected to all of the exposed portions 13b. The first electrode 11 is disposed not only on the first semiconductor layer 13n, but also above the second semiconductor layer 13p. In other words, the first electrode 11 is disposed, via the insulating film 14, on the side surfaces of the light emitting layer 13a, the side surfaces of the second semiconductor layer 13p, and the upper surface of the second semiconductor layer 13p.

Note that when the semiconductor layered body 13 includes the outer peripheral portion 13no, the first electrode is preferably connected to a portion of the outer peripheral portion 13no. Further, when the first semiconductor layer 13n includes the outer peripheral exposed portion 13c, the first electrode 11 is preferably connected to the outer peripheral exposed portion 13c.

The second electrode 12 is disposed on the second semiconductor layer 13p and is connected to the second semiconductor layer 13p at the opening portions 14b of the insulating film 14 above the second semiconductor layer 13p.

The first electrode 11 and the second electrode 12 are not in contact with the first semiconductor layer 13n and the second semiconductor layer 13p, respectively, and may be electrically connected thereto via a conductive member such as a light reflective electrode 16 to be described below.

When the planar shape of the semiconductor layered body 13 has a rectangular shape, similarly, the planar shape of the outer edge of the first electrode 11 and the second electrode 12 is also preferably rectangular or substantially rectangular. In a plan view, the first electrode 11 and the second electrode 12 provided on one semiconductor layered body 13 are preferably disposed alternately in the second direction S. For example, in a plan view, the second electrode 12 is preferably disposed between the first electrodes 11. In particular, when the semiconductor layered body 13 has a rectangular shape having short sides along the first direction F, it is preferable that, in a plan view, the second electrode 12 has a rectangular shape that is long in the first direction F, and that the first electrodes 11 are disposed with the second electrode 12 interposed therebetween in the second direction S. However, when the second electrode 12 is disposed between the first electrodes 11 in a plan view, the first electrodes 11 may be connected to each other at either side of the second electrode 12.

The first electrode 11 and the second electrode 12 may be formed, for example, of a single-layer or layered film of a metal such as Au, Pt, Pd, Rh, Ni, W, Mo, Cr, Ti, Al, or Cu, or an alloy thereof. Specifically, the first electrode 11 and the second electrode 12 can be formed of a layered film such as Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, Al—Si—Cu alloy/Ti/Pt/Au, Ti/Rh, or the like, each of which is layered in that order from the semiconductor layered body 13 side. The film thickness of the first electrode 11 and the second electrode 12 may be any film thickness of a film used in this field. Note that "Ti/Rh/Au" layered in that order from the semiconductor layered body 13 side means that Ti, Rh, and Au are layered in that order from the semiconductor layered body 13 side.

Light Reflective Electrode 16

The light emitting element 10 preferably includes the light reflective electrode 16 interposed between the first electrode 11 and/or the second electrode 12, and the second semiconductor layer 13p.

As the light reflective electrode 16, an alloy whose principal components are Ag and Al, or one of those metals can be used, and in particular, it is preferable to use silver or a silver alloy having high light reflectivity with respect to light emitted from the light emitting layer 13a. The light reflective electrode 16 preferably has a thickness that can effectively reflect the light emitted from the light emitting layer 13a, and the thickness may be from 100 nm to 500 nm, for example. The greater the contact area between the light reflective electrode 16 and the second semiconductor layer 13p, the more preferable the configuration. Specifically, the total planar area of the light reflective electrode 16 may be 50% or more, 60% or more, or 70% or more of the planar area of the semiconductor layered body 13. The light reflective electrode 16 is preferably formed of a metal material having a reflectivity of 70% or more, or preferably of 80% or more with respect to a peak wavelength of the light from the light emitting layer 13a.

When the light reflective electrode 16 contains silver, a protective layer 17 covering the upper surface, or preferably the upper surface and the side surfaces of the light reflective electrode 16 may be provided to prevent migration of the silver. The protective layer 17 may be formed of a material similar to that of the insulating film 14 described above. For example, SiN is preferably used as the material of the protective layer 17. Since a film formed of SiN is a dense film and can be easily formed, it is an excellent material for suppressing the penetration of moisture. The thickness of the protective layer 17 may be from 100 nm to 1 μm to effectively prevent the migration of the silver. When the protective layer 17 is formed by an insulating member, the protective layer 17 can cause the light reflective electrode 16 and the second electrode 12 to be electrically connected to each other by having an opening above the light reflective electrode 16. Note that when the light emitting element 10 includes the light reflective electrode 16 and the protective layer 17 on the second semiconductor layer 13p, the insulating film 14 covering the semiconductor layered body 13 covers the light reflective electrode 16 and the protective layer 17, and has an opening in a region directly below the second electrode 12. As a result, the second electrode 12 and the light reflective electrode 16 are electrically connected to each other.

First External Connection Portion 1 and Second External Connection Portion 2

The first external connection portion 1 and the second external connection portion 2 are provided to be connected to wires to be described below.

The first external connection portion 1 is connected to the first electrode 11. The first external connection portion 1 is provided on the first electrode 11 provided on the upper surface of the insulating film 14 above the second semiconductor layer 13p, and is connected to the first electrode 11.

The first external connection portion 1 is disposed so as to be spaced apart from the exposed portion 13b in a plan view. Further, when the outer peripheral exposed portion 13c is present, the first external connection portion 1 is also spaced apart from the outer peripheral exposed portion 13c.

A plurality of the first external connection portions 1 are disposed on the first electrode 11. The first external connection portions 1 include at least two portions, namely, the first portions 1-1 and the second portions 1-2. The plurality of first portions 1-1 and second portions 1-2 are disposed along the first direction F.

The first portion 1-1 is positioned between the exposed portions 13b in the first direction F parallel to the one side of the semiconductor layered body 13. For example, in a plan view, two of the first portions 1-1 may be disposed so as to sandwich one exposed portion 13b. The first portion 1-1 is spaced apart from the exposed portion 13b.

An interval between the first portion 1-1 and the exposed portion 13b in the first direction F may be from 12 μm to 28 μm, for example. By disposing the first portion 1-1 and the exposed portion 13b in close proximity to each other in this manner, heat generated around the exposed portion 13b can be efficiently released. Further, since the first portion 1-1 and the exposed portion 13b do not overlap with each other in a plan view, damage to the semiconductor layered body 13 around the exposed portion 13b, which occurs at a time of bonding, can be suppressed.

The plurality of first portions 1-1 disposed between the exposed portions 13b are spaced apart from each other. The first portions 1-1, which are spaced apart from each other between the adjacent exposed portions 13b, are preferably spaced apart by 16 μm or more, for example. By setting such a distance, even when the first external connection portion 1 expands at the time of bonding, it is possible to prevent the adjacent first external connection portions 1 from coming into contact with each other. Then, the uncured resin material constituting the resin member 32 can be allowed to flow while suppressing generation of a void or the like between the first external connection portions 1. As a result, peeling or the like of the light emitting element caused by thermal expansion of a gas present between the light emitting element and the substrate can be effectively prevented.

The second portion 1-2 is not positioned between the exposed portions 13b in the first direction F. and has the planar shape that is different in shape or size from that of the first portion 1-1. However, the second portion 1-2 may be positioned between the exposed portions 13b in the second direction S. For example, in a plan view, two of the second portions 1-2 may be disposed so as to sandwich one exposed portion 13b. The second portion 1-2 is spaced apart from the exposed portion 13b.

The number of the first external connection portions 1, for example, the numbers of the first portions 1-1 and the second portions 1-2, can be set appropriately in accordance with the number of the exposed portions 13b formed in the semiconductor layered body 13. For example, it is sufficient that the numbers of the first portions 1-1 and the second portions 1-2 be two or more with respect to one exposed portion 13b, and may be three, four or more, for example. However, depending on the positions of the exposed portions 13b, the numbers and/or shapes of the first portions 1-1 and the second portions 1-2 may be varied, or regardless of the positions of the exposed portions 13b, the shapes and/or sizes of the first portions 1-1 and the second portions 1-2 may be varied. For example, depending on the positions of the first portions 1-1 and the second portions 1-2, such as the position facing the outer edge of the semiconductor layered body 13, the position facing the second electrode 12, the position on the inner side of the semiconductor layered body 13, and the position adjacent to the outer peripheral exposed portion 13c, the numbers, sizes, and/or shapes of the first portions 1-1 and the second portions 1-2 may be varied, or some of the numbers, sizes, and/or shapes of the first portions 1-1 and the second portions 1-2 may be varied.

Note that the first portions 1-1 and the second portions 1-2 may include those disposed regularly or randomly, as long as the first portions 1-1 and the second portions 1-2 are disposed as described above.

Examples of the shape of the first portion 1-1 and the second portion 1-2 in a plan view include various shapes, such as polygonal shapes including triangular and quadrangular shapes, a fan-shape, a semi-circular shape, a circular shape, an elliptical shape, an annular shape, a shape obtained by cutting out a part of the shape mentioned above, and a polygonal shape partially including a curved line. Of those, the shape of the first portion 1-1 and the second portion 1-2 is preferably a quadrangular shape, a shape including a curved line on one side of the quadrangular shape, a quadrangular shape whose corners are partially rounded, a combination of those shapes, or the like. For example, by setting the shape of the first portion 1-1 and the second portion 1-2 to be the quadrangular shape, the first external connection portions 1 are easily disposed at a higher density and at equal intervals.

Specifically, the first portion 1-1 may have a planar shape having a curved portion k on a side facing the exposed portion 13b, and the second portion 1-2 may have a quadrangular planar shape. When the planar shape of the exposed portion 13b is a circular shape, by the first portion 1-1 including the curved portion k corresponding to the shape of the exposed portion 13b on the side facing the exposed portion 13b, the area of the first external connection portion 1 disposed in close proximity to the exposed portion 13b can be made greater. As a result, the heat dissipation performance can be improved.

In addition to the first portions 1-1 and the second portions 1-2, the first external connection portion 1 may further include at least one of a third portion 1-3, a fourth portion 1-4, a fifth portion 1-5, and an eighth portion 1-8. In a plan view, the third portion 1-3 preferably has a planar area greater than the planar area of the first portion 1-1 or the second portion 1-2, around a corner of the semiconductor layered body 13. The planar area of the third portion 1-3 is preferably twice or more, or three times or more the planar area of the first portion 1-1 or the second portion 1-2, for example. One third portion 1-3 or two or more of the third portions 1-3 may be disposed around one corner of the semiconductor layered body 13, or at least one third portion 1-3 may be disposed around two or more corners of the semiconductor layered body 13, respectively. By disposing this type of the third portion 1-3 having a relatively large planar area around the corner of the semiconductor layered body 13, a probe configured to check the current and voltage during and after a manufacturing process can be easily brought into contact with the third portion 1-3.

When the semiconductor layered body 13 includes the outer peripheral exposed portion 13c, the fourth portion 1-4 is adjacent to the outer peripheral exposed portion 13c, or so as to follow the shape of the outer peripheral exposed portion 13c. One fourth portion 1-4 may be disposed with respect to one outer peripheral exposed portion 13c, or two or more of the fourth portions 1-4 may be disposed so as to be adjacent to each other. At least one of the fourth portions 1-4 is preferably disposed with respect to all of the outer peripheral exposed portions 13c, respectively. Further, in a plan view, the fourth portion 1-4 preferably has a planar shape including a curved portion r1 on a side facing the outer peripheral exposed portion 13c. By the fourth portion 1-4 including the curved portion r1 corresponding to the shape of the outer peripheral exposed portion 13c on the side facing the outer peripheral exposed portion 13c, the area of the first external connection portion 1 disposed in close proximity to the outer peripheral exposed portion 13c can be made greater. When a plurality of the fourth portions 1-4 are disposed, each of the curved portions r1 included in the fourth portions 1-4 may have a different shape depending on the shape and position of the outer peripheral exposed portion 13c.

In a plan view, the fifth portion 1-5 is preferably provided adjacent to the second external connection portion 2, in the vicinity of an end portion of the second semiconductor layer 13p in the first direction F. In a plan view, the fifth portion 1-5 preferably has a planar shape including an inclined portion m that is inclined with respect to the one side of the semiconductor layered body 13, on a side facing the second external connection portion 2. An inclination angle of the inclined portion m with respect to the one side of the semiconductor layered body 13 may be from 45° to 60°, for example. By the fifth portion 1-5 including the inclined portion m, a short-circuit with the wire of the substrate 23, which will be described below, can be effectively prevented. Only one fifth portion 1-5 may be disposed, or two or more of the fifth portions 1-5 may be disposed adjacent to each other. In this case, when two or more of the fifth portions 1-5 are disposed, the sizes and/or shapes thereof may be the same or different from each other.

The shapes, sizes, numbers, and the like of the third portion 1-3, the fourth portion 1-4, and the fifth portion 1-5 can be set appropriately within the same range as exemplified above in relation to the first portion 1-1 and the second portion 1-2, except that the above-described curved portion r1 and inclined portion m are additionally provided.

The eighth portion 1-8 is disposed adjacent to the second portion 1-2, is not positioned between the exposed portions 13b in the first direction F, and has a planar shape that is different in shape or size from that of the first portion 1-1. The size of the eighth portion 1-8 can be set as desired. The eighth portion 1-8 may be positioned between the exposed portions 13b in the second direction S. At least one eighth portion 1-8 is preferably disposed in one light emitting portion and at least four eighth portions 1-8 are preferably disposed in one light emitting element 10. In the present embodiment, two eighth portions 1-8 are disposed in one light emitting portion. In particular, in a case where the planar shape of the light emitting element 10 is quadrangular, each eighth portion 1-8 is preferably disposed in a region (hereinafter referred to as "region near the corner portion") having an area that is ⅑ or less of the entire area of the light emitting element 10 and including quadrilateral corners. "Region near the corner portion" refers to one region where the entire region of the light emitting element 10 is divided into portions, for example, 9 or more portions, having the same area. The planar shape of the eighth portion 1-8 is preferably circular or substantially circular.

By providing the eighth portions 1-8, when the light emitting element 10 is disposed on and bonded to a substrate including a wiring line, it is possible to check the bonding performance between the light emitting element 10 and the wiring line from the planar shape of each eighth portion 1-8 after bonding. In particular, when the planar shape of the eighth portion 1-8 is circular or substantially circular, the eighth portion 1-8 collapses in a concentric shape, and thus, the amount by which the eighth portion 1-8 has widened after bonding is easily determined compared to a case where the planar shape of the eighth portion 1-8 is quadrangular. In addition, by disposing the eighth portion 1-8 in the region near the corner portion, in which the first external connection portion 1 is less likely to collapse than in the central region of the light emitting element 10, and determining bonding performance, it becomes easy to determine that the first external connection portion 1 has collapsed in the light emitting element 10. This makes it possible to evaluate bonding performance more accurately.

The total planar area of the first external connection portion 1 can be set appropriately in accordance with the size of the semiconductor layered body 13, the number and size of the exposed portions 13b, and the like. For example, it is sufficient that the total planar area of the first external connection portion be 40% or more of the planar area of the semiconductor layered body 13, and it is preferably 70% or less of the planar area of the semiconductor layered body 13. By having such a range, while ensuring the heat dissipation performance, manufacturing costs of the first external connection portion 1 can be reduced, for example, when a material forming the first external connection portion 1 is an expensive metal.

For example, the first external connection portion 1 is preferably disposed at a density of 150 units/mm$^2$ or more, more preferably disposed at a density of 150 units/mm$^2$ to 400 units/mm$^2$, and even more preferably disposed at a density of 200 units/mm$^2$ to 300 units/mm$^2$. An interval between the first portions 1-1 adjacent to each other, an interval between the second portions 1-2 adjacent to each other and an interval between the first portion 1-1 and the second portion 1-2, and further optionally, an interval between any one of the first portion 1-1 to the fifth portion 1-5 and any other one of the first portion 1-1 to the fifth portion 1-5, or an interval between the same portions, are preferably 16 µm or more, more preferably from 16 µm to 50 µm, and even more preferably from 16 µm to 30 µm. By having such an interval, for example, even if the planar area of the first external connection portion 1 and the like expands when the light emitting element is bonded to the wire on the substrate, it is possible to prevent the first external connection portions 1 adjacent to each other from coming into contact with each other. Further, by having such an interval, as will be described below, the resin member 32 constituting the light emitting device and having light reflectivity is easily inserted into a space between the first external connection portions 1.

The planar area of one of the portions of the first external connection portion 1 can be set appropriately in accordance with the size of the planar area of the semiconductor layered body 13. For example, when the size of the semiconductor layered body 13 in a plan view is 0.8 mm to 1.2 mm×0.8 mm to 1.2 mm, the planar area of the one of the portions of the first external connection portion 1 may be from 100 µm$^2$ to 10000 µm$^2$, and is preferably from 500 µm$^2$ to 8000 µm$^2$. For example, the planar area of the first portion 1-1, the second portion 1-2, or the fourth portion 1-4 may be from 500 µm$^2$ to 1000 µm$^2$. Specifically, the first portion 1-1, the second portion 1-2, and the fourth portion 1-4 may each have a planar area of 20 µm×40 µm or greater. The planar area of the third portion 1-3 or the fifth portion 1-5 may be from 3000 µm$^2$ to 7000 µm$^2$. Specifically, the third portion 1-3 and the fifth portion 1-5 may each have a planar area of 60 µm×60 µm or greater.

The second external connection portion 2 is connected to the second electrode 12. The plurality of second external connection portions 2 are disposed on the second electrode 12. The second external connection portion 2 preferably includes a plurality of sixth portions 2-6 and a plurality of seventh portions 2-7, for example.

The second external connection portion 2 is preferably disposed between the first external connection portions 1 in the second direction S.

Examples of the shape of the sixth portion 2-6 and the seventh portion 2-7 in a plan view include various shapes, such as polygonal shapes including triangular and quadrangular shapes, a fan-shape, a semi-circular shape, a circular shape, an elliptical shape, an annular shape, an annular fan-shape, and a shape obtained by cutting out a part of the shape mentioned above.

A plurality of the sixth portions 2-6 may be disposed in a matrix pattern on the second electrode 12. The seventh portions 2-7 may be disposed on both sides, in the first direction F, of the plurality of sixth portions 2-6. The seventh portion 2-7 preferably has a planar area greater than the planar area of the sixth portion 2-6. The seventh portion 2-7 has a shape that is long in the second direction S. and may have a length shorter than the length of the second electrode 12 in the second direction S. For example, the seventh portion 2-7 may have a length of 70% to 90% of the length of the second electrode 12 in the second direction S. Each of the sixth portions 2-6 may be different in size and/or shape, or may have the same size and shape. Each of the seventh portions 2-7 may be different in size and/or shape, or may have the same size and shape. For example, the seventh portions 2-7 disposed on both the sides, in the first direction F, of the plurality of sixth portions 2-6 preferably have planar shapes different in shape or size from each other. Specifically, in a plan view, the seventh portion 2-7 adjacent to one end of the semiconductor layered body 13 in the first direction F may include a missing portion t at which a corner portion of the seventh portion 2-7 is missing on a side facing the one end of the semiconductor layered body 13. The missing portion t may be inclined at an angle of 45° to 60° with respect to the one side of the semiconductor layered body 13, for example. The planar area of the seventh portion 2-7 is preferably greater than the planar area of the third portion 1-3 of the first external connection portion 1. For example, the planar area of the seventh portion 2-7 may be from 120% to 250% of the planar area of the third portion 1-3, and is preferably from 130% to 200% of the planar area of the third portion 1-3. Specifically, when the planar area of the third portion 1-3 is 60 μm×60 μm or greater (e.g., 60 μm×88 μm), the planar area of the seventh portion 2-7 may be 65 μm×65 μm or greater (65 μm×130 μm). The planar area of the seventh portion 2-7 is preferably greater than the planar area of the sixth portion 2-6. By disposing this type of the seventh portion 2-7 having a relatively large planar area at the one end of the semiconductor layered body 13, a probe configured to test the current/voltage during and after the manufacturing process can be easily brought into contact with the seventh portion 2-7.

An interval between the sixth portions 2-6 adjacent to each other, an interval between the seventh portions 2-7 adjacent to each other, and an interval between the sixth portion 2-6 and the seventh portion 2-7 are preferably 16 μm or more, more preferably from 16 μm to 50 μm, and even more preferably from 16 μm to 30 μm. By having such an interval, as described above, when the light emitting element is bonded to the wire on the substrate, it is possible to prevent the second external connection portions 2 adjacent to each other from coming into contact with each other. However, the interval between the sixth portions 2-6 adjacent to each other, the interval between the seventh portions 2-7 adjacent to each other, and the interval between the sixth portion 2-6 and the seventh portion 2-7 need not necessarily be all the same.

The sixth portions 2-6 and the seventh portions 2-7 may be disposed regularly or randomly in the first direction F, as long as the above-described arrangements are satisfied. Further, the sixth portions 2-6 and the seventh portions 2-7 may be different in shape and/or size depending on the locations at which they are disposed on the semiconductor layered body 13. For example, the size of the second external connection portion 2 can be set to 80% to 500%, 80% to 200%, or 80% to 150% of the first external connection portion 1.

The first external connection portion 1 and the second external connection portion 2 can each be formed by a known method in this field. Examples of the method include a plating method, a sputtering method, a vapor deposition method, and the like.

The first external connection portion 1 and the second external connection portion 2 can be formed using a single-layer or layered structure of a metal such as Al, Ag, Cu, Au, or Ni, or of an alloy including those metals.

Note that the thickness of the first external connection portion 1 and the second external connection portion 2 can be set appropriately in accordance with the size of the light emitting element 10, and the like. For example, the thickness may be from 1 μm to 50 μm, and is preferably from 10 μm to 30 μm.

When the semiconductor layered body 13 includes one semiconductor layered body 13 on one support substrate 15, the first external connection portions 1 and the second external connection portions 2 are preferably disposed symmetrically with respect to the bisector bisecting the area of the semiconductor layered body 13 or the area of the light emitting portion in the first direction F or the second direction S, respectively.

When the semiconductor layered body 13 includes the plurality of light emitting portions as described above, the semiconductor layered body 13 is preferably symmetrical in terms of the arrangement of the first external connection portion 1 and the second external connection portion 2 in the first light emitting portion 10X, the arrangement of the first external connection portion 1 and the second external connection portion 2 in the second light emitting portion 10Y, and a bisector bisecting the area of the support substrate 15.

Light Emitting Device 33

Figure 2A:
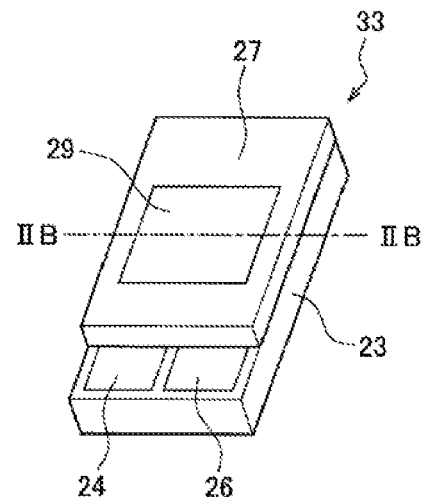
FIG. 2A is a perspective view schematically illustrating a light emitting device according to an embodiment of the present disclosure.
Figure 2B:
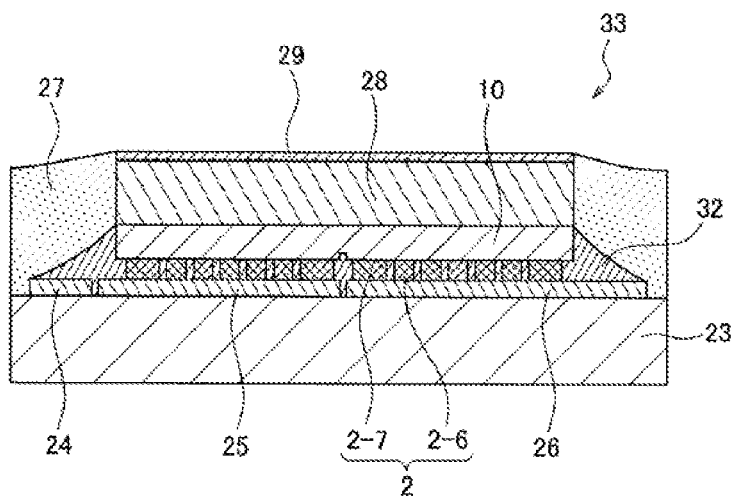
FIG. 2B is a cross-sectional view along a line IIB-IIB in FIG. 2A.

As illustrated in FIGS. 2A and 2B, a light emitting device 33 according to an embodiment of the present disclosure includes the substrate 23 including a plurality of wires 24, 25, and 26 on the upper surface thereof, the light emitting element 10 described above (or a light emitting element to be described below), and a cover member 27. Only one light emitting element 10 may be disposed on the substrate 23, or two or more of the light emitting elements 10 may be disposed thereon. The light emitting element 10 is flip-chip mounted on the wires 24, 25, and 26 via the plurality of first external connection portions 1 and the plurality of second external connection portions 2. A portion of the first wire 24 and a portion of the third wire 26 are exposed from the cover member 27.

Substrate 23

The substrate 23 can be formed, for example, of an insulating member such as glass epoxy, resin, or ceramics, a metal member on a front surface of which the insulating member is formed, or the like. Of those, a ceramic having high heat resistance and weather resistance is preferably used as the material of the substrate 23. Examples of the ceramic material include alumina, aluminum nitride, and the like. Furthermore, the ceramic material may be layered on a metal member made of, for example, aluminum.

It is sufficient that the wires 24, 25, and 26 can supply the current to the light emitting element 10, and the wires 24, 25, and 26 are formed with a material, thickness, shape, and the like commonly used in this field. Specifically, the wires 24, 25, and 26 can be formed of a metal such as copper, aluminum, gold, silver, platinum, titanium, tungsten, palladium, iron, or nickel, an alloy containing those metals, or the like. In particular, the wires 24, 25, and 26 formed on the upper surface of the substrate 23 are preferably formed with the outermost surfaces thereof covered with a material having a high reflectivity such as silver or gold, in order to efficiently extract light from the light emitting element 10. The wires 24, 25, and 26 are formed by an electrolytic plating method, an electroless plating method, a vapor deposition method, a sputtering method, or the like. For example, when the outermost surfaces of the first external connection portion 1 and the second external connection portion 2 of the light emitting element 10 are formed of gold, the outermost surfaces of the wires 24, 25, and 26 are preferably also formed of Au. As a result, the bonding performance between the light emitting element 10 and the wires on the substrate 23 can be improved.

When the light emitting element 10 is flip-chip mounted on the substrate 23 via the wires 24, 25, and 26 using a surface, of the light emitting element 10, on which the first external connection portions 1 and the second external connection portions 2 are formed as the lower surface of the light emitting element 10, the upper surface on the opposite side of the lower surface becomes the main light extraction surface of the light emitting element 10. The wires 24, 25, and 26 may be disposed not only on the upper surface of the substrate 23, but also inside and/or on the lower surface of the substrate 23.

In particular, when the light emitting element 10 including the two light emitting portions is provided, for example, when the light emitting element 10 is used in which the first light emitting portion 10X and the second light emitting portion 10Y, each including the first external connection portion 1 and the second external connection portion 2, are formed on the support substrate 15, as illustrated in FIGS.

3A and 3B, it is preferable to use the wires that include the first wire 24 (the first wire portion) connected to the first external connection portion 1 of the first light emitting portion 10X, the second wire 25 (the second wire portion) connected to the second external connection portion 2 of the first light emitting portion 10X and the first external connection portion 1 of the second light emitting portion 10Y, and the third wire 26 (the third wire portion) connected to the second external connection portion 2 of the second light emitting portion 10Y. In the light emitting element 10, the first external connection portion 1 of the first light emitting portion 10X is connected to the first wire 24, and the second external connection portion 2 of the first light emitting portion 10X is connected to the second wire 25. Further, in the light emitting element 10, the first external connection portion 1 of the second light emitting portion 10Y is connected to the second wire 25, and the second external connection portion 2 of the second light emitting portion 10Y is connected to the third wire 26.

Further, in the second direction S, a portion, of the second wire 25, to which the second external connection portion 2 of the first light emitting portion 10X is connected is preferably positioned between the first wires 24, and a portion, of the third wire 26, to which the second external connection portion 2 of the second light emitting portion 10Y is connected is preferably positioned between the second wires 25. In a plan view, the first wire 24 includes a concave region in a portion thereof on a side facing the second wire 25 in the first direction F, and the second wire 25 includes a concave region in a portion thereof on a side facing the third wire 26 in the first direction F. The second wire 25 includes a convex region in a portion thereof on a side facing the first wire 24 in the first direction F, and the third wire 26 includes a convex region in a portion thereof on a side facing the second wire 25 in the first direction F. Then, the convex region of the second wire 25 is positioned in the concave region of the first wire 24, and the convex region of the third wire 26 is positioned in the concave region of the second wire 25.

Figure 3A:
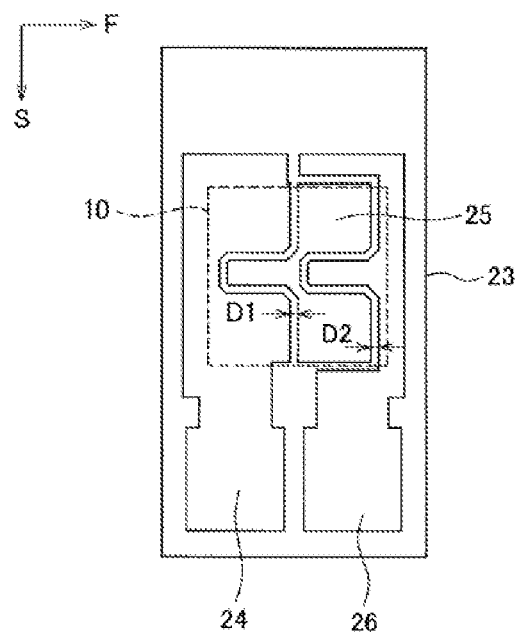
FIG. 3A is a plan view schematically illustrating a substrate used in the light emitting device according to an embodiment of the present disclosure.
Figure 3B:
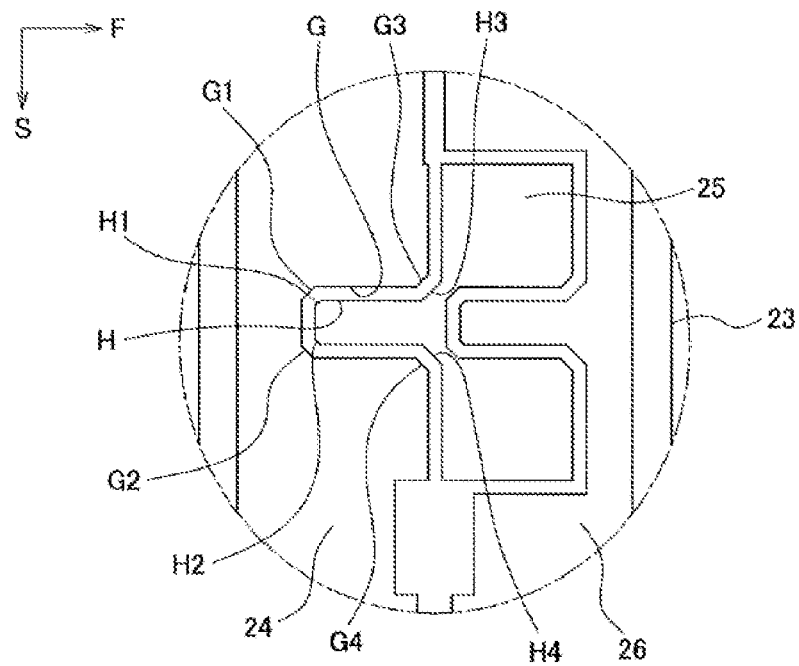
FIG. 3B is an enlarged view of main portions illustrated in FIG. 3A.

For example, as illustrated in FIG. 3B, a concave region G of the first wire 24 includes inclined portions G1 and G2 at positions facing corner portions of the convex region of the second wire 25. Further, the concave region G of the first wire 24 includes inclined portions G3 and G4 at positions facing corner portions of the convex region of the third wire 26. A convex region H of the second wire 25 includes inclined portions H1 and H2 having a constant distance from the inclined portions G1 and G2, respectively, at positions facing the inclined portions G1 and G2. Further, the convex region of the second wire 25 includes inclined portions H3 and H4 having a constant distance from the inclined portions G3 and G4, respectively. The concave region of the second wire 25 and the convex region of the third wire 26 also preferably have the same shapes in correlation to the relationship between the concave region of the first wire 24 and the convex region of the second wire 25. A distance D1 between the first wire 24 and the second wire 25 and a distance D2 between the second wire 25 and the third wire 26 may be from 30 μm to 70 μm in a plan view. These distances D1 and D2 are preferably constant between the first wire 24 and the second wire 25, and between the second wire 25 and the third wire 26, respectively.

By using such wires, the two light emitting portions can be connected in series. Further, by adopting such shapes of the wires, the distance between the first wire 24 and the second wire 25 and the distance between the second wire 25 and the third wire 26 are made shorter, and thus the distance between the two light emitting portions can be narrowed.

Figure 3C:
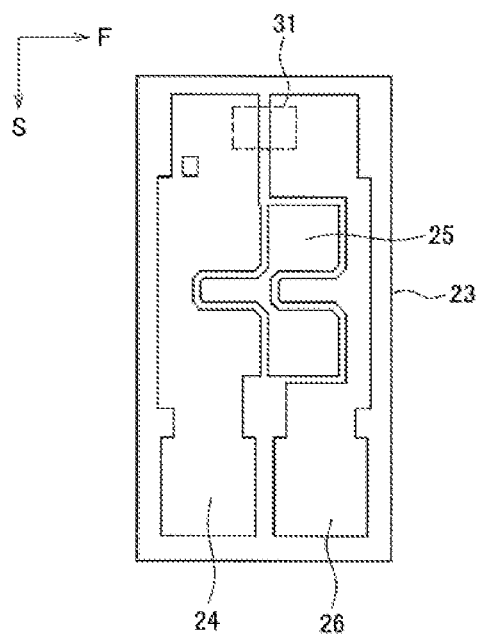
FIG. 3C is a plan view schematically illustrating the substrate used in the light emitting device according to another embodiment of the present disclosure.
Figure 3D:
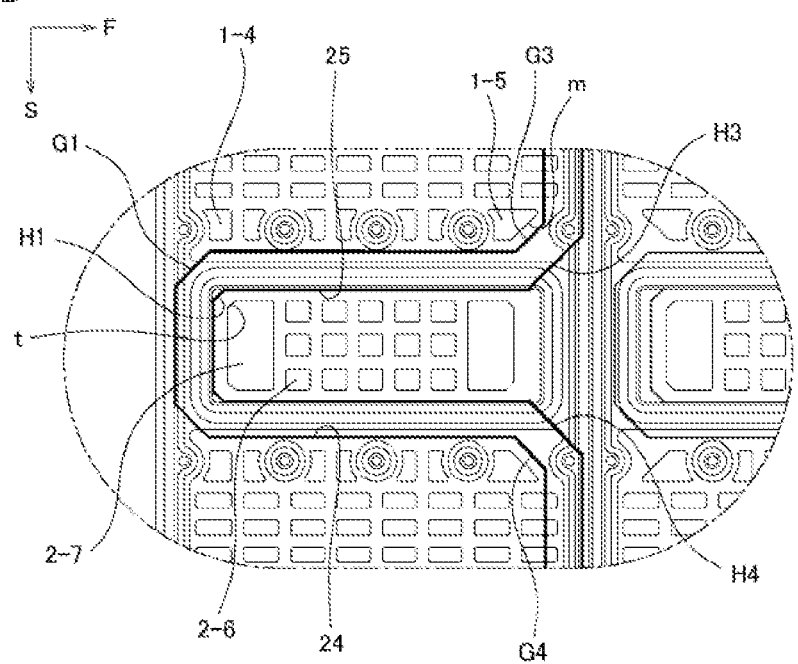
FIG. 3D is an enlarged view of main portions of the light emitting element illustrated in FIG. 1A when the light emitting element is placed on the substrate illustrated in FIG. 3A.

In particular, when the light emitting element 10 is disposed on the substrate 23 illustrated in FIG. 3B, the second external connection portion 2 of the first light emitting portion 10X faces the convex region of the second wire 25, and the second external connection portion 2 of the second light emitting portion 10Y faces the convex region of the third wire 26. Then, as illustrated in FIG. 3D, the missing portions t of the seventh portion 2-7 of the second external connection portion 2 are disposed so as to correspond to the inclined portions H1 and H2 in the convex region of the second wire 25. Further, the inclined portions m of the fifth portion 1-5 of the first external connection portion 1 are disposed so as to correspond to the inclined portions G3 and G4 in the concave region G of the first wire 24. In this way, by forming the shapes of the fifth portion 1-5 of the first external connection portion 1 and/or the seventh portion 2-7 of the second external connection portion 2 so as to correspond to the wires 24 and 25, it is possible to prevent a short-circuit between the two light emitting portions from occurring. FIG. 3D is a schematic diagram for describing relationships between the shapes of the wires and the arrangement of the first external connection portions 1 and the second external connection portions 2, and thus all the constituent members are illustrated with solid lines.

The first external connection portion 1 and the second external connection portion 2 can be bonded to the wires 24, 25, and 26 using an ultrasonic bonding method, for example. When bonding the first external connection portion 1 and the second external connection portion 2 to the wires 24, 25, and 26, heat and/or pressure may be applied while applying ultrasonic vibrations.

Cover Member 27

The cover member 27 covers the light emitting element 10, the first external connection portions 1, the second external connection portions 2, and the substrate 23. In other words, the cover member 27 covers the side surfaces of the light emitting element 10, a section between the light emitting element 10 and the substrate 23, and the side surfaces of the first external connection portions 1 and the second external connection portions 2. The cover member 27 is preferably also disposed directly below the exposed portions 13b on the lower surface of the light emitting element 10. Further, as will be described below, when the light emitting device 33 includes a light transmissive member 28 on the upper surface of the light emitting element 10, the cover member 27 preferably also covers the side surfaces of the light transmissive member 28.

The cover member 27 can be formed of a resin having light reflective properties, light transmissive properties, light shielding properties, and the like, or a resin or the like obtained by adding, to the above-described resin, a light reflective substance, a phosphor, a diffusing material, a coloring agent, or the like. Of those, the cover member 27 preferably has the light reflective and/or light shielding properties. Any resins, light reflective substances, and the like normally used in this field can be used to constitute the cover member 27. Examples of the resin include a resin or a hybrid resin including at least one of a silicone resin, a modified silicone resin, an epoxy resin, a modified epoxy resin, and an acrylic resin, and the like. Examples of the light reflective substance include titanium oxide, silicon oxide, zirconium oxide, potassium titanate, alumina, aluminum nitride, boron nitride, mullite, and the like.

An amount of light reflection, an amount of light transmission, and the like can be varied by changing the content of the light reflective substance or the like contained in the material constituting the cover member 27. The cover member 27 preferably contains 20 wt % or more of the light reflective substance, for example.

The cover member 27 can be molded by injection molding, potting molding, transfer molding, compression molding, or the like, for example.

Before disposing the cover member 27, the resin member 32 may be disposed, for example, on the side surfaces of the light emitting element 10, the side surfaces of the electrodes of the light emitting element 10, the side surfaces of the first external connection portions 1 and the second external connection portions 2, and the section between the light emitting element 10 and the substrate 23. This resin member 32 preferably has light reflectivity. By providing this type of the resin member 32, the light traveling from the light emitting element 10 toward the substrate 23 can be reflected toward the light emitting element 10 side, and the light extraction efficiency can be improved.

Light Transmissive Member 28

The light emitting device 33 preferably includes the light transmissive member 28 on the upper surface of the light emitting element 10. The light transmissive member 28 is disposed covering the light extraction surface of the light emitting element 10. The light transmissive member 28 is a member that can transmit 50% to 60% or preferably 70% or more of the light emitted from the light emitting element 10 and that can emit the light to the outside. The light transmissive member 28 can contain a phosphor that can perform wavelength conversion of at least a portion of the light emitted from the light emitting element 10. Further, the light transmissive member 28 may contain a light diffusing material that diffuses the light emitted from the light emitting element 10. The light transmissive member 28 preferably has a plate-like shape, and the thickness of the light transmissive member 28 may be from 50 µm to 300 µm, for example.

The light transmissive member 28 can be formed, for example, of resin, glass, or an inorganic substance, or the like. Further, examples of the light transmissive member 28 containing the phosphor include a sintered body obtained by sintering a phosphor, glass or another inorganic substance containing the phosphor, and the like. Further, the light transmissive member 28 containing the phosphor may be obtained by forming a resin layer containing a phosphor on a front surface of a molded body formed of plate-like resin, glass, or inorganic substance, or the like.

Examples of the phosphor contained in the light transmissive member 28 include an yttrium aluminum garnet based phosphor ($Y_3(Al,Ga)_5O_{12}$:Ce, for example), a lutetium aluminum garnet based phosphor ($Lu_3(Al,Ga)_5O_{12}$:Ce, for example), a terbium aluminum garnet based phosphor ($Tb_3(Al,Ga)_5O_2$:Ce, for example), a β-SiALON based phosphor ((Si,Al)3(O,N)4:Eu, for example), an α based SiAlON phosphor (Ca(Si,Al)12(O,N)16:Eu, for example), an SLA based phosphor (SrLiAl3N4:Eu, for example), a nitride based phosphor such as a CASN based phosphor (CaAlSiN3:Eu, for example) or an SCASN based phosphor ((Sr,Ca)AlSiN3:Eu, for example), a fluoride phosphor such as a KSF based phosphor (K2SiF6:Mn, for example), a KSAF based phosphor (K2(Si,Al)F6:Mn, for example), or an MGF based phosphor (3.5MgO·0.5MgF2GeO2:Mn, for example), a phosphor having a perovskite structure ($CsPb(F,Cl,Br,I)_3$, for example), a quantum dot phosphor (CdSe, InP, $AgInS_2$, or $AgInSe_2$, for example), and the like. By combining those phosphors with a light emitting element that emits blue light or a light emitting element that emits ultraviolet light, a light emitting device of a desired light emission color can be obtained. When such a phosphor is contained in the light transmissive member 28, the content of the phosphor is preferably from 5 wt % to 50 wt %, for example.

The light transmissive member 28 is bonded so as to cover the light extraction surface of the light emitting element 10. The light transmissive member 28 and the light emitting element 10 can be bonded together directly or via an adhesive material. For example, a light transmissive resin material, such as epoxy or silicone, can be used as the adhesive material. The light transmissive member 28 and the light emitting element 10 may be bonded together by a direct bonding method, using pressure bonding, sintering, surface activation bonding, atomic diffusion bonding, hydroxyl group bonding, or the like. For the purposes of protecting the light transmissive member 28, preventing the light reflection, or the like, a cover layer 29 may be disposed on the upper surface of the light transmissive member 28. Examples of the cover layer 29 include an anti reflection (AR) layer, and the like.

The light emitting device 33 may optionally include another element such as a protective element, an electronic component, or the like. Those element and electronic component are preferably embedded in the cover member 27. Specifically, as illustrated in FIG. 3C, a protective element 31 may be disposed that electrically connects the first wire 24 and the third wire 26.

First Embodiment

As illustrated in FIGS. 1A to 1C, the light emitting element 10 according to a first embodiment includes the semiconductor layered body 13, the insulating film 14, the first electrodes 11 and the second electrodes 12, and the first external connection portions 1 and the second external connection portions 2.

The semiconductor layered body 13 is constituted by the first semiconductor layer 13n, the light emitting layer 13a, and the second semiconductor layer 13p that are layered on the support substrate 15 in this order from the support substrate 15 side. The support substrate 15 is formed of sapphire and has a protrusion and recession structure on the upper surface thereof. The shape of the support substrate 15 in a plan view is substantially a square shape, and one side thereof has a length of 1.1 mm, for example. The semiconductor layered body 13 serves as the first light emitting portion 10X and the second light emitting portion 10Y disposed side by side in the first direction F, each having a rectangular shape that has short sides along the first direction F. The first light emitting portion 10X and the second light emitting portion 10Y each include the first semiconductor layer 13n, the light emitting layer 13a, and the second semiconductor layer 13p. The first semiconductor layer 13n is exposed from the second semiconductor layer 13p and the light emitting layer 13a of the semiconductor layered body 13, and includes the plurality of exposed portions 13b surrounded by the second semiconductor layer 13p in a plan view. The exposed portions 13b each have a circular shape in a plan view, and are disposed in a matrix pattern. Specifically, in each of the first light emitting portion 10X and the second light emitting portion 10Y, three columns of the exposed portions 13b are arrayed along the first direction F, and four rows of the exposed portions 13b are arrayed along the second direction S. The exposed portion 13b has a circular shape having a diameter of approximately 12 µm in a plan view. The distance between the adjacent exposed portions 13b is approximately 120 µm in the first direction F and the second direction S, respectively.

In a plan view, the semiconductor layered body 13 includes the outer peripheral portion 13no from which the first semiconductor layer 13n is exposed at the outer periphery thereof, and further includes the outer peripheral exposed portion 13c in which the first semiconductor layer 13n is exposed from the second semiconductor layer 13p and the light emitting layer 13a, at the outer periphery of the second semiconductor layer 13p. The outer peripheral exposed portion 13c is disposed as part of the outer peripheral portion 13no. The outer peripheral exposed portions 13c are disposed at the same positions as the exposed portions 13b, namely, three of the outer peripheral exposed portions 13c are disposed along the first direction F and four of the outer peripheral exposed portions 13c are disposed along the second direction S in each of the first light emitting portion 10X and the second light emitting portion 10Y.

As illustrated in FIGS. 1B and 1C, the semiconductor layered body 13 is covered by the insulating film 14 formed of $SiO_2$. The insulating film 14 has the opening portions 14a and 14b at least above the plurality of exposed portions 13b and above regions of the second semiconductor layer 13p to which the second electrode 12 is connected, respectively.

In a cross-sectional view, the light reflective electrode 16 formed of silver is disposed between the second semiconductor layer 13p and the first electrode 11 and/or the second electrode 12. The light reflective electrode 16 is disposed on substantially the entire upper surface of the second semiconductor layer 13p. The light reflective electrode 16 is covered by the protective layer 17 whose upper surface and side surfaces are formed of SiN or $SiO_2$.

The light emitting element 10 includes the second electrode 12 connected to the second semiconductor layer 13p, on the upper surface side of the semiconductor layered body 13 via the light reflective electrode 16. The second electrode 12 is disposed in a region including the center of each of the first light emitting portion 10X and the second light emitting portion 10Y of the light emitting element 10 in a plan view. The shape of the second electrode 12 in a plan view is the rectangular shape having long sides along the first direction F. and the second electrode 12 is formed so as to have a size of 180 µm×460 µm.

In a plan view, the first light emitting portion 10X and the second light emitting portion 10Y each include the first electrodes 11 disposed so as to sandwich the second electrode 12 in the second direction S. The first electrode 11 is connected to the exposed portions 13b at the opening portions 14a of the insulating film 14, and further, is formed on the second semiconductor layer 13p via the insulating film 14.

The first external connection portion 1 is disposed on the first electrode 11. The first external connection portion 1 is spaced apart from the exposed portions 13b.

The plurality of first external connection portions 1 are disposed including the plurality of first portions 1-1, the plurality of second portions 1-2, the plurality of third portions 1-3, the plurality of fourth portions 1-4, and the plurality of fifth portions 1-5.

Two of the first portions 1-1 are disposed so as to sandwich one exposed portion 13b in the first direction F. Further, two of the first portions 1-1 are disposed between the adjacent exposed portions 13b while being spaced apart from each other. The interval between the first portion 1-1 and the exposed portion 13b in the first direction F is 16 µm, for example. The first portions 1-1 that are spaced apart from each other are spaced apart by 16 µm, for example. The first portion 1-1 has a rectangular shape that is long in the second direction S. and includes the curved portion k on the side facing the exposed portion 13b. The curved portion k is provided with the curved line corresponding to the planar shape of the exposed portion 13b. The first portion 1-1 has a size of 40 µm×20 µm, for example. Further, the first portion 1-1, which is provided adjacent to the second electrode 12 and faces the exposed portion 13b, has a smaller planar area than that of the first portion 1-1 described above.

The second portions 1-2 are arrayed along the first direction F. and each have a planar shape that is different in shape and size from that of the first portion 1-1. For example, the second portion 1-2 has a rectangular shape that is long in the first direction F, and has a size of 20 µm×40 µm. Eight of the second portions 1-2 are disposed in the first direction F, and three rows of the second portions 1-2 are disposed between the exposed portions 13b. Further, four, three, or two rows of the second portions 1-2 are disposed between the exposed portion 13b and the outer periphery of the semiconductor layered body 13 in the second direction S. The second portion 1-2 disposed between the exposed portion 13b and the outer periphery of the semiconductor layered body 13 in the second direction S has a rectangular shape that is long in the first direction F, and has a size of 30 µm×40 µm.

The third portion 1-3 is disposed in each of the first light emitting portion 10X and the second light emitting portion 10Y. In a plan view, the third portions 1-3 are disposed at four corners of the second semiconductor layer 13p. The size of the third portion 1-3 in a plan view is 60 µm×88.5 µm, for example.

One or two of the fourth portions 1-4 are disposed adjacent to each of the outer peripheral exposed portions 13c disposed at the outer periphery of the semiconductor layered body 13 along the first direction F. One fourth portion 1-4 is disposed adjacent to each of the outer peripheral exposed portions 13c disposed at the outer periphery of the semiconductor layered body 13 along the second direction S. Each of the fourth portions 1-4 adjacent to the outer peripheral exposed portions 13c has one of mutually different curved portions r1, r2, r3 and r4, on the side thereof facing the outer peripheral exposed portion 13c. When two of the fourth portions 1-4 face one outer peripheral exposed portion 13c disposed along the first direction F, each of the fourth portions 1-4 has a rectangular shape including the curved portion r1 at a corner, of the rectangular shape, facing the outer peripheral exposed portion 13c. When one fourth portion 1-4 faces one outer peripheral exposed portion 13c disposed along the first direction F, the fourth portion 1-4 has a rectangular shape in which a short side thereof facing the outer peripheral exposed portion 13c includes the curved portion r2. When one fourth portion 1-4 faces one outer peripheral exposed portion 13c disposed along the second direction S, the fourth portion 1-4 has a rectangular shape in which a long side thereof facing the outer peripheral exposed portion 13c includes the curved portion r3. The fourth portion 1-4 facing the outer peripheral exposed portion 13c closest to the second electrode 12 has a rectangular shape in which a long side thereof facing the outer peripheral exposed portion 13c includes the curved portion r4, and has a shape having a smaller planar area than that of the fourth portion 1-4 including the curved portion r3.

The fifth portion 1-5 is disposed in each of the first light emitting portion 10X and the second light emitting portion 10Y. In a plan view, the fifth portion 1-5 is provided adjacent to the second electrode 12 at one end of the second semiconductor layer 13p in the first direction F. In a plan view, the fifth portion 1-5 includes the inclined portion m inclined with respect to the one side of the second semiconductor layer 13p, on a side thereof facing the second electrode 12. Further, in a plan view, the fifth portion 1-5 includes a curved portion corresponding to the shape of the exposed portion 13b on a side thereof facing the exposed portion 13b.

The plurality of second external connection portions 2 are disposed on the second electrode 12. The second external connection portions 2 include the plurality of sixth portions 2-6 and the plurality of seventh portions 2-7.

The sixth portions 2-6 are disposed on the second electrode 12 in a matrix pattern, for example, in a pattern of 3×5. The sixth portion 2-6 has a substantially square planar shape. The sixth portion 2-6 has a size of 30 μm×30 μm, for example.

One seventh portion 2-7 is disposed on each side of the plurality of sixth portions 2-6 in the first direction F. The seventh portion 2-7 has an elongated rectangular planar shape in the second direction S. The seventh portion 2-7 has a size of 65 μm×133 μm, for example. The seventh portion 2-7 has a rectangular shape in which the corners thereof located on the outer side of the first light emitting portion 10X or the second light emitting portion 10Y are missing.

A distance between any one of the first portion 1-1, the second portion 1-2, the third portion 1-3, the fourth portion 1-4, the fifth portion 1-5, the sixth portion 2-6, and the seventh portion 2-7, and the adjacent one of the first to seventh portions 1-1 to 2-7 is approximately 16 μm.

The first external connection portions 1 are disposed at a density of 250 units/mm$^2$ or more, and the second external connection portions 2 are disposed at a density of 25 units/mm$^2$ or more.

The thickness of the first external connection portion 1 and the second external connection portion 2 is 19 μm.

The first external connection portions 1 and the second external connection portions 2 disposed in the first light emitting portion 10X, and the first external connection portions 1 and the second external connection portions 2 disposed in the second light emitting portion 10Y are disposed symmetrically with respect to the bisector bisecting the area of the support substrate 15. Further, in each of the first light emitting portion 10X and the second light emitting portion 10Y, the first external connection portions 1 and the second external connection portions 2 are disposed symmetrically with respect to the bisector bisecting the area of the semiconductor layered body 13 in the second direction S.

Each of the first portion 1-1 to the seventh portion 2-7 may also be referred to as described below. The first portion 1-1 is an inter-exposed portions connection portion. The second portion 1-2 is an intermediate connection portion. The third portion 1-3 is an outer corner connection portion. The fourth portion 1-4 is an inner corner connection portion. The fifth portion 1-5 is an inclined connection portion. The sixth portion 2-6 is an inner side connection portion. The seventh portion 2-7 is an outer side connection portion.

In this type of the light emitting element 10, by disposing the plurality of first external connection portions 1 and second external connection portions 2 at a high density within a small planar area, the force applied to the electrodes, the insulating film, the semiconductor layered body, and the like at the time of bonding can be alleviated using the first external connection portions 1 and the like, while ensuring the bonding performance with the substrate 23. Furthermore, when the light emitting element 10 is bonded to the wires on the substrate 23, the first external connection portions 1 expand, but it is possible to prevent the first external connection portions 1 adjacent to each other from coming into contact with each other. As a result, the uncured resin material constituting the resin member 32, which constitutes the light emitting device, can be easily poured into the spaces between the first external connection portions 1. In this way, the light extraction efficiency of the light emitting device can be improved, and at the same time, peeling of the light emitting element 10 caused by thermal expansion of a gas can be prevented, the gas being generated as a result of a void being present between the first external connection portions 1. Further, since the first external connection portions 1 and the second external connection portions 2 disposed in the first light emitting portion 10X and the second light emitting portion 10Y are disposed symmetrically in the second direction S, a bias in the force applied to the first external connection portions 1 and the second external connection portions 2 can be alleviated when flip-chip mounting the light emitting element 10 onto the substrate 23. In this way, a bonding accuracy between the light emitting element 10 and the substrate 23 can be stabilized. As a result, a light emitting device with a high heat dissipation performance, high reliability, and high light extraction efficiency can be provided.

Second Embodiment

A light emitting element 10A according to a second embodiment has substantially the same configuration as that of the light emitting element 10, except that the positions of the outer peripheral exposed portions 13c, and the shapes of the third portion 1-3 and the fourth portion 1-4 of the first external connection portion 1 facing the outer peripheral exposed portion 13c are different from those in the light emitting element 10, as illustrated in FIG. 4.

The outer peripheral exposed portions 13c are disposed at each of corner portions of the semiconductor layered body 13 in a plan view. Four of the outer peripheral exposed portions 13c are disposed along the first direction F and six thereof are disposed along the second direction S. 16 of the outer peripheral exposed portions 13c are disposed in one semiconductor layered body 13.

The third portion 1-3 includes a curved portion z at a portion thereof facing the outer peripheral exposed portion 13c disposed at the corner of the semiconductor layered body 13.

Two of the fourth portions 1-4 are disposed so as to face one outer peripheral exposed portion 13c disposed along the first direction F. and each of those rectangular fourth portions 1-4 includes the curved portion r1 at the corner facing the outer peripheral exposed portions 13c.

The light emitting element 10A as described above can also achieve the same effects as those of the light emitting element 10 described above.

Third Embodiment

A light emitting element 10B according to a third embodiment has substantially the same configuration as that of the light emitting element 10, except that the positions of the outer peripheral exposed portions 13c, the shape of the fourth portion 1-4 of the first external connection portion 1 facing the outer peripheral exposed portion 13c, the positions of the exposed portions 13b, the shape of the second portion 1-2 facing the exposed portion 13b, and the size of the sixth portion 2-6 of the second external connection portion 2 are different from those in the light emitting element 10, as illustrated in FIG. 5.

In each of the first light emitting portion 10X and the second light emitting portion 10Y, the exposed portions 13b are arrayed in two columns along the first direction F and in two rows along the second direction S.

In each of the first light emitting portion 10X and the second light emitting portion 10Y, two of the outer peripheral exposed portions 13c are disposed along the first direction F, and four thereof are disposed along the second direction S. 12 of the outer peripheral exposed portions 13c are disposed in one semiconductor layered body 13.

The plurality of first external connection portions 1 are disposed including the plurality of first portions 1-1, the plurality of second portions 1-2, the plurality of third portions 1-3, the plurality of fourth portions 1-4, and the plurality of fifth portions 1-5.

In the first direction F, two of the first portions 1-1 are disposed so as to sandwich one exposed portion 13b therebetween. Two of the first portions 1-1 are disposed between the adjacent exposed portions 13b while being spaced apart from each other. The first portion 1-1 has a rectangular shape having long sides along the first direction F, and includes the curved portion k on the side facing the exposed portion 13b. The first portion 1-1 has a size of 20 µm×30 µm in a plan view, for example.

The second portion 1-2 has a rectangular shape having long sides along the second direction S and having short sides of various lengths in the first direction F, and has a size of 10 µm to 30 µm×40 µm. 12 of the second portions 1-2 are disposed in the first direction F, and two columns of the second portions 1-2 are disposed between the exposed portions 13b in the second direction S. Further, three rows, two rows, or one row of the second portions 1-2 are disposed between the exposed portion 13b and the outer periphery of the semiconductor layered body 13 in the second direction S.

The third portion 1-3 has a rectangular shape having long sides along the second direction S, and has a size of 60 µm×100 µm, for example.

Two of the fourth portions 1-4 are adjacent to one outer peripheral exposed portion 13c disposed at the outer periphery of the semiconductor layered body 13 along the first direction F. One fourth portion 1-4 is adjacent to each of the outer peripheral exposed portions 13c disposed at the outer periphery of the semiconductor layered body 13 along the second direction S.

Two of the fifth portions 1-5 are provided in each of the first light emitting portion 10X and the second light emitting portion 10Y. In a plan view, the fifth portion 1-5 is provided adjacent to the second electrode 12 at one end of the second semiconductor layer 13p in the first direction F. In a plan view, each of the fifth portions 1-5 includes the inclined portion m inclined with respect to the one side of the second semiconductor layer 13p, on the side facing the second electrode 12.

The plurality of second external connection portions 2 are disposed on the second electrode 12. The second external connection portions 2 include the plurality of sixth portions 2-6 and the plurality of seventh portions 2-7.

The sixth portions 2-6 are disposed on the second electrode 12 in a matrix pattern, for example, in a pattern of 3×4. The sixth portion 2-6 has a substantially square planar shape. The sixth portion 2-6 has a size of 35 µm×35 µm, for example.

One seventh portion 2-7 is disposed on each side of the plurality of sixth portions 2-6 in the first direction F. The seventh portion 2-7 has an elongated rectangular planar shape in the second direction S. The seventh portion 2-7 has a size of 75 µm×140 µm, for example. The seventh portion 2-7 has a rectangular shape in which the corners thereof located on the outer side of the first light emitting portion 10X or the second light emitting portion 10Y are missing.

Each of the first portion 1-1, the second portion 1-2, the third portion 1-3, the fourth portion 1-4, the fifth portion 1-5, the sixth portion 2-6, and the seventh portion 2-7 does not necessarily have the same shape and size depending on its location, or the same shape as the shape of the adjacent one of the first to seventh portions 1-1 to 2-7.

The first external connection portions 1 are disposed at a density of 250 units/mm$^2$ or more, and the second external connection portions 2 are disposed at a density of 25 units/mm$^2$ or more.

This light emitting element 10B can also achieve the same effects as those of the light emitting elements 10 and 10A.

Fourth Embodiment

As illustrated in FIG. 6, in a light emitting element 10C according to a fourth embodiment, one semiconductor layered body 13 having a substantially square shape is disposed on one support substrate 15.

In the semiconductor layered body 13, the exposed portions 13b are arrayed in four rows along the first direction F, and arrayed in five columns in the second direction S. Further, five of the outer peripheral exposed portions 13c are disposed along the first direction F and four thereof are disposed along the second direction S. 18 of the outer peripheral exposed portions 13c are disposed in one semiconductor layered body 13.

Each of the first external connection portions 1 and the second external connection portions 2 is substantially the same as that disposed at the light emitting element 10B, except that the numbers and/or shapes of the first external connection portion 1 and the second external connection portion 2 are different in accordance with the size of the semiconductor layered body 13, the fifth portions 1-5 are not provided, and the planar shape of the seventh portion 2-7 is substantially rectangular.

This light emitting element 10C can also achieve the same effects as those of the light emitting elements 10 and 10B.

Fifth Embodiment

As illustrated in FIG. 7, in a light emitting element 10D according to a fifth embodiment, one semiconductor layered body 13 having a substantially square shape is disposed on one support substrates 15.

In the semiconductor layered body 13, the exposed portions 13b are arrayed in four rows along the first direction F, and arrayed in six columns along the second direction S. Further, six of the outer peripheral exposed portions 13c are disposed along the first direction F, and four thereof are disposed along the second direction S. 20 of the outer peripheral exposed portions 13c are disposed in one semiconductor layered body 13. Each of the first external connection portions 1 and the second external connection portions 2 is substantially the same as that disposed at the light emitting element 10, except that the numbers and/or shapes of the first external connection portion 1 and the second external connection portion 2 are different in accordance with the size of the semiconductor layered body 13, the fifth portions 1-5 are not provided, and the planar shape of the seventh portion 2-7 is substantially rectangular.

This light emitting element 10D can also achieve the same effects as those of the light emitting element 10.

Sixth Embodiment

Figure 8:
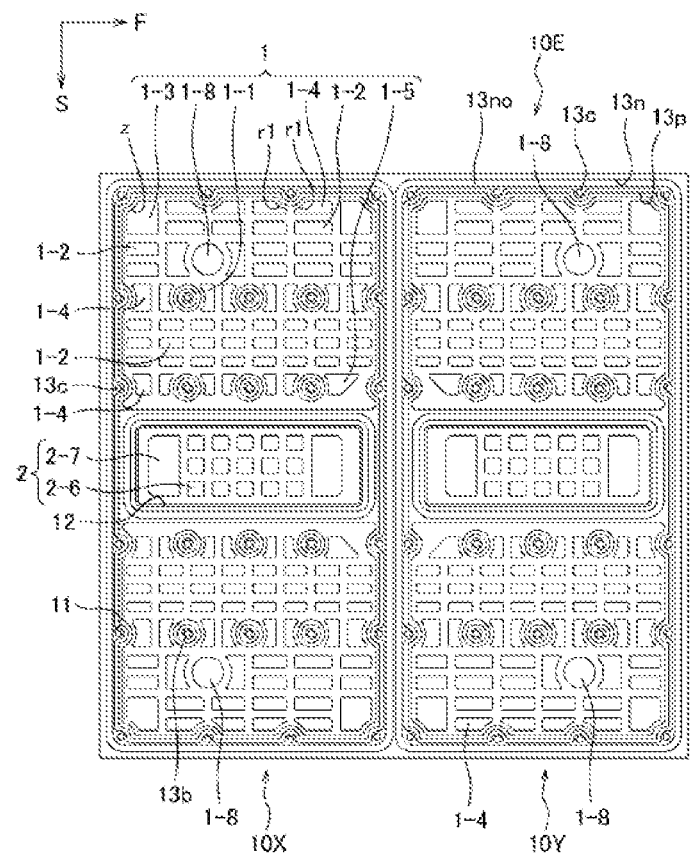
FIG. 8 is a plan view schematically illustrating a light emitting element according to a sixth embodiment of the present disclosure.

As illustrated in FIG. 8, in a light emitting element 10E according to a sixth embodiment, the positions of the outer peripheral exposed portions 13c, and the shapes of the third portion 1-3 and the fourth portion 1-4 of the first external connection portion 1 facing the outer peripheral exposed portion 13c, are different. Furthermore, the light emitting element 10E has substantially the same configuration as that of the light emitting element 10, except that each eighth portion 1-8 is disposed in the region near the corner portion, that is, in a region having an area that is ⅛ or less of the entire area of the semiconductor layered body and including corners, in the light emitting element 10E.

The positions of the outer peripheral exposed portions 13c, and the shapes of the third portion 1-3 and the fourth portion 1-4 of the first external connection portion 1 facing the outer peripheral exposed portion 13c are substantially different from those in the light emitting element 10A.

This light emitting element 10E can also achieve the same effects as those of the light emitting elements 10 and 10A.

Seventh Embodiment

As illustrated in FIGS. 2A and 2B and FIGS. 3A to 3D, the light emitting device 33 according to a seventh embodiment includes the substrate 23 including the wires 24, 25, and 26 on the upper surface thereof, the above-described light emitting element 10, the cover member 27, and the light transmissive member 28.

The substrate 23 is formed of aluminum nitride, and includes the wires 24, 25, and 26 on the upper surface thereof. The outermost surfaces of the wires 24, 25, and 26 are formed of Au. The distances D1 and D2 between the wires 24, 25, and 26 are 50 μm, for example. On the substrate 23, the light emitting element 10 is flip-chip mounted using the surface on which the first external connection portions 1 and the second external connection portions 2 are formed as the mounting surface.

In other words, when the light emitting element 10 is disposed, the second external connection portion 2 of the first light emitting portion 10X faces the convex region of the second wire 25, and the second external connection portion 2 of the second light emitting portion 10Y faces the convex region of the third wire 26. Then, as illustrated in FIG. 3D, the missing portions t of the seventh portion 2-7 of the second external connection portion 2 are disposed so as to correspond to the inclined portions H1 and H2 in the convex region of the second wire 25. Further, the inclined portions m of the fifth portion 1-5 of the first external connection portion 1 are disposed so as to correspond to the inclined portions G3 and G4 in the concave region G of the first wire 24.

The light transmissive member 28, which is formed of a ceramic containing approximately 15 wt % of the phosphor is bonded to the upper surface of the light emitting element 10. The thickness of the light transmissive member 28 is approximately 180 μm, and in a plan view, the outer edge of the lower surface of the light transmissive member 28 is disposed so as to be substantially aligned with the outer edge of the light emitting element 10.

For example, as illustrated in FIG. 3C, the protective element 31 that electrically connects the wire 24 and the wire 26 is disposed at a side of the light emitting element 10. The protective element 31 is a Zener diode, for example.

The cover member 27 is disposed on the side surfaces of the light emitting element 10, and between the light emitting element 10 and the substrate 23. The cover member 27 further covers the upper surface of the substrate 23, all of the side surfaces of the first external connection portion 1 and the second external connection portion 2, and the protective element 31 is also embedded inside the cover member 27. Further, the cover member 27 exposes the front surface of the cover layer 29 disposed on the upper surface of the light transmissive member 28, and covers the side surfaces of the light transmissive member 28 and the cover layer 29.

The cover member 27 is formed of a modified silicone resin containing approximately 30 wt % of titanium oxide, and has light reflectivity.

In the light emitting device having such a configuration, the light emitting element 10 is bonded to the substrate 23 in a state in which the high heat dissipation performance is secured, and at the same time, damage to the electrodes and the like caused by the external force applied at the time of bonding can be prevented in the vicinity of the exposed portion 13b. Further, it is possible to prevent the short circuit between two of the light emitting portions from occurring, while reducing the distance between the two light emitting portions. Accordingly, the light emitting device having high reliability and high light extraction efficiency can be obtained.

Eighth Embodiment

Figure 9A:
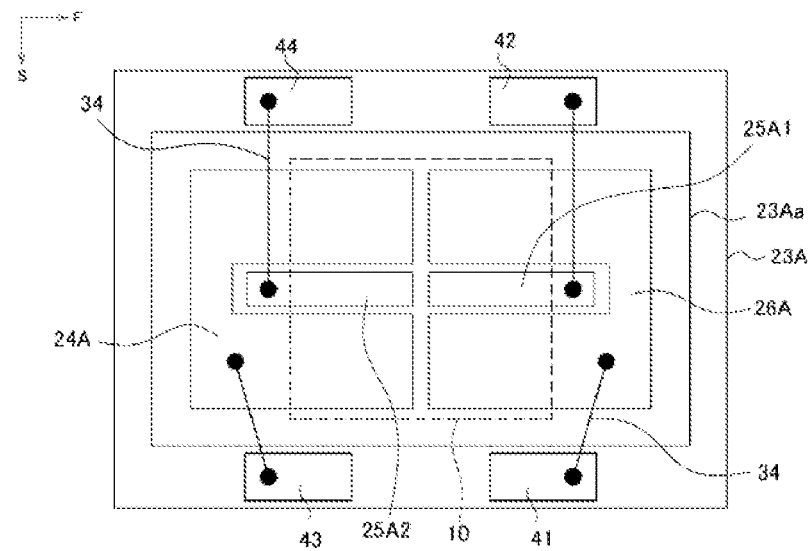
FIG. 9A is a plan view schematically illustrating a light emitting device according to an embodiment of the present disclosure.

A light emitting device according to an eighth embodiment includes the light emitting element 10, a first substrate 23A, a second substrate 23Aa, and a conductive member 34. As illustrated in FIG. 9A, the first substrate 23A includes a plurality of external terminals, for example, a first external terminal 41, a second external terminal 42, a third external terminal 43, and a fourth external terminal 44, on the upper surface of the first substrate 23A. The second substrate 23Aa is disposed on the first substrate 23A, and includes a plurality of wiring lines, for example, a first wiring line 26A, a second wiring line 25A1, a third wiring line 24A, and a fourth wiring line 25A2, on the upper surface of the second substrate 23Aa. The first substrate 23A is, for example, an aluminum substrate. The second substrate 23Aa is, for example, an aluminum nitride substrate.

On the second substrate 23Aa, the light emitting element 10 is flip-chip mounted using the surface on which the first external connection portions 1 and the second external connection portions 2 are formed as the mounting surface.

The first wiring line 26A is electrically connected to the first external connection portion 1 of the first light emitting portion 10X in the light emitting element 10. The second wiring line 25A1 is electrically connected to the second external connection portion 2 of the first light emitting portion 10X. The third wiring line 24A is electrically connected to the first external connection portion 1 of the second light emitting portion 10Y. The fourth wiring line 25A2 is electrically connected to the second external connection portion 2 of the second light emitting portion 10Y.

The first external terminal 41, the second external terminal 42, the third external terminal 43, and the fourth external terminal 44 are electrically connected to the first wiring line 26A, the second wiring line 25A1, the third wiring line 24A, and the fourth wiring line 25A2, respectively, via the conductive member 34. For example, a metal wire can be used as the conductive member 34. Specifically, the first external terminal 41 and the first wiring line 26A, the second external terminal 42 and the second wiring line 25A1, the third external terminal 43 and the third wiring line 24A, and the fourth external terminal 44 and the fourth wiring line 25A2 are electrically connected by the conductive member 34.

The circuit connecting the first light emitting portions 10X in series is configured by electrically connecting the first external terminal 41, the first wiring line 26A, the second wiring line 25A1, and the second external terminal 42. The circuit connecting the second light emitting portions 10Y in series is configured by electrically connecting the third external terminal 43, the third wiring line 24A, the fourth wiring line 25A2, and the fourth external terminal 44. For example, by appropriately changing the value of the current flowing into each circuit, the first light emitting portion 10X and the second light emitting portion 10Y can be individually controlled. For example, when the value of the current flowing through the first light emitting portion 10X is lower than the value of the current flowing through the second light emitting portion 10Y, the light output on the first light emitting portion 10X side can be relatively low in the light emitting element 10.

Ninth Embodiment

Figure 9B:
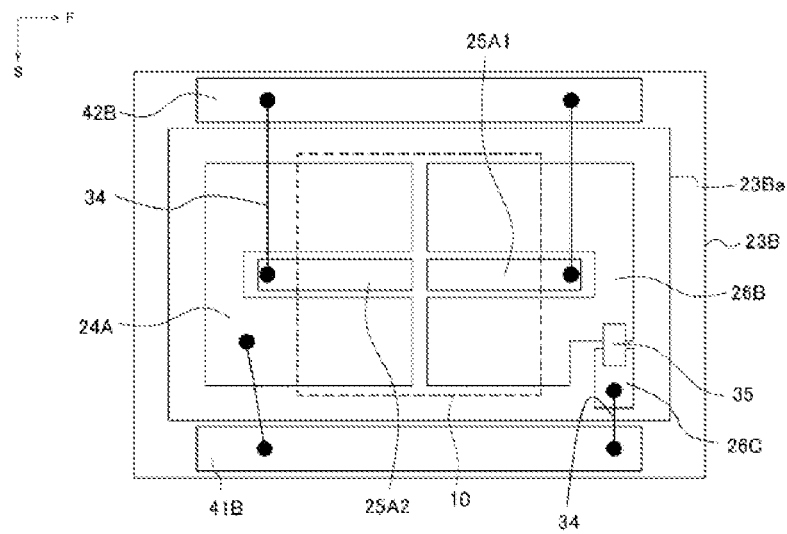
FIG. 9B is a plan view schematically illustrating a light emitting device according to an embodiment of the present disclosure.

A light emitting device according to a ninth embodiment includes the light emitting element 10, a first substrate 23B, a second substrate 23Ba, and the conductive member 34. As illustrated in FIG. 9B, the first substrate 23B includes a plurality of external terminals, for example, a first external terminal 41B and a second external terminal 42B, on the upper surface of the first substrate 23B. The second substrate 23Ba is disposed on the first substrate 23B, and includes a plurality of wiring lines, for example, a first wiring line 26B, the second wiring line 25A 1, the third wiring line 24A, the fourth wiring line 25A2, and a conductive layer 26C, on the upper surface of the second substrate 23Ba. The conductive layer 26C is disposed adjacent to the first wiring line 26B and is electrically insulated from the first wiring line 26B. A constant current diode 35 is connected in series to the first wiring line 26B and the conductive layer 26C.

The first external terminal 41B is electrically connected to the conductive layer 26C and the third wiring line 24A by the conductive member 34. The second external terminal 42B is electrically connected to each of the second wiring line 25A 1 and the fourth wiring line 25A2 by the conductive member 34. A circuit in which the first light emitting portion 10X and the second light emitting portion 10Y in the light emitting element 10 are connected in parallel between the first external terminal 41B and the second external terminal 42B is configured. The constant current diode 35 is connected in series with the first light emitting portion 10X.

The circuit connecting the first light emitting portions 10X in series is configured by electrically connecting the first external terminal 41B, the conductive layer 26C, the constant current diode 35, the first wiring line 26B, the second wiring line 25A1, and the second external terminal 42B. The circuit connecting the second light emitting portions 10Y in series is configured by electrically connecting the first external terminal 41B, the third wiring line 24A, the fourth wiring line 25A2, and the second external terminal 42B. Apart from these configurations, the ninth embodiment has substantially the same configuration as the eighth embodiment.

By providing the constant current diode 35 in this manner, the light output of the first light emitting portion 10X can be made relatively lower than the light output of the second light emitting portion 10Y, by one circuit and not individually controlling the light emitting portions by using two circuits.

Note that, in the ninth embodiment, an example is described in which the constant current diode 35 is disposed, but the circuit connecting the second light emitting portions 10Y in series may be a circuit through which a constant current flows through the second light emitting portions 10Y, and the constant current diode 35 need not be disposed.

What is claimed is:

1. A light emitting element comprising:
a semiconductor layered body having a rectangular planar shape and including a first semiconductor layer, a light emitting layer, and a second semiconductor layer in this order, the semiconductor layered body defining a plurality of exposed portions in which the first semiconductor layer is exposed from the second semiconductor layer and the light emitting layer, each of the exposed portions being surrounded by the second semiconductor layer in a plan view;
an insulating film covering the semiconductor layered body, and defining a plurality of opening portions respectively above the exposed portions;
a first electrode connected to the exposed portions at the opening portions, a portion of the first electrode being disposed on the second semiconductor layer via the insulating film;
a second electrode connected to the second semiconductor layer;
a first external connection portion connected to the first electrode and spaced apart from the exposed portions in the plan view; and
a second external connection portion connected to the second electrode, wherein
in the plan view, the first external connection portion includes
a plurality of first portions located between the exposed portions in a first direction parallel to one side of the semiconductor layered body, and arrayed in the first direction, with a number of the first portions disposed between adjacent ones of the exposed portions being two or more,
a plurality of second portions not located between the exposed portions in the first direction, and arrayed in the first direction, each of the second portions being different in shape or size from each of the first portions, and
a third portion located around a corner portion of the semiconductor layered body, the third portion having a planar area greater than each of a planar area of the first portion and a planar area of the second portion, and
an interval between the first portions adjacent to each other in the first direction, an interval between the second portions adjacent to each other in the first direction, and an interval between the first portion and the second portion in a second direction orthogonal to the first direction are each 16 µm or more.

2. The light emitting element according to claim 1 wherein
the first external connection portion is disposed at a density of 150 units/mm² or more.

3. The light emitting element according to claim 1, wherein
a planar area of one of the first portions of the first external connection portion is from 100 µm² to 1000 µm².

4. The light emitting element according to claim 1, wherein
  each of the first portions has a shape having a curved portion on a side facing the exposed portion in the plan view, and
  the second portion has a quadrangular shape in the plan view.

5. The light emitting element according to claim 1, wherein
  in the plan view, the first semiconductor layer further includes an outer peripheral exposed portion disposed at an outer periphery of the second semiconductor layer and in which the first semiconductor layer is exposed from the second semiconductor layer and the light emitting layer,
  the first electrode is connected to the outer peripheral exposed portion, and
  the first external connection portion further includes a plurality of fourth portions each disposed adjacent to the outer peripheral exposed portion, each of the fourth portions having a planar shape having a curved portion on a side facing the outer peripheral exposed portion in the plan view.

6. The light emitting element according to claim 1, wherein
  the exposed portions are disposed in a matrix pattern.

7. The light emitting element according to claim 1, wherein
  the first external connection portion is arranged in a plurality of groups, and
  the second external connection portion is disposed between the groups of the first external connection portion in the plan view.

8. The light emitting element according to claim 1, wherein
  the second external connection portion includes a plurality of sixth portions disposed in a matrix pattern, and a plurality of seventh portions disposed on both sides of the plurality of sixth portions in the first direction, each of the seventh portions having a planar area greater than a planar area of each of the sixth portions.

9. The light emitting element according to claim 8, wherein
  in the plan view, the seventh portions disposed on both the sides of the plurality of sixth portions in the first direction have mutually different shapes or sizes.

10. The light emitting element according to claim 1, wherein,
  the first external connection portion is provided adjacent to the second external connection portion near an end portion of the second semiconductor layer in the first direction in the plan view, and
  the first external connection portion further includes a fifth portion having a planar shape having an inclined portion inclined with respect to the one side of the semiconductor layered body, on a side facing the second external connection portion.

11. The light emitting element according to claim 1, wherein
  the first external connection portion further includes an eighth portion having a circular planar shape, the eight portion being not located between the exposed portions in the first direction.

12. A light emitting device comprising:
  the light emitting element according to claim 1;
  a substrate including a plurality of wires on an upper surface thereof, the light emitting element being flip-chip mounted on the plurality of wires via the first external connection portion and the second external connection portion; and
  a cover member containing a light reflective substance, the cover member covering the light emitting element, the first external connection portion, the second external connection portion, and the substrate.

13. The light emitting device according to claim 12, wherein
  the light emitting element includes a first light emitting portion and a second light emitting portion disposed on the substrate, each of the first light emitting portion and the second light emitting portion includes the first external connection portion and the second external connection portion, and
  the plurality of wires include
    a first wire portion connected to the first external connection portion of the first light emitting portion,
    a second wire portion connected to the second external connection portion of the first light emitting portion and the first external connection portion of the second light emitting portion, and
    a third wire portion connected to the second external connection portion of the second light emitting portion.

14. The light emitting device according to claim 13, wherein
  in a second direction orthogonal to the first direction,
  a portion of the second wire portion connected to the second external connection portion of the first light emitting portion is located between parts of the first wire portion, and
  a portion of the third wire portion connected to the second external connection portion of the second light emitting portion is located between parts of the second wire portion.

15. The light emitting device according to claim 13, wherein
  in the plan view, a distance between the first wire portion and the second wire portion and a distance between the second wire portion and the third wire portion, in a second direction orthogonal to the first direction, are each from 30 μm to 70 μm.

16. A light emitting element comprising:
  a semiconductor layered body having a rectangular planar shape and including a first semiconductor layer, a light emitting layer, and a second semiconductor layer in this order, the semiconductor layered body defining a plurality of exposed portions in which the first semiconductor layer is exposed from the second semiconductor layer and the light emitting layer, each of the exposed portions being surrounded by the second semiconductor layer in a plan view;
  an insulating film covering the semiconductor layered body, and defining a plurality of opening portions respectively above the exposed portions;
  a first electrode connected to the exposed portions at the opening portions, a portion of the first electrode being disposed on the second semiconductor layer via the insulating film;
  a second electrode connected to the second semiconductor layer;
  a first external connection portion connected to the first electrode and spaced apart from the exposed portions in the plan view; and
  a second external connection portion connected to the second electrode, wherein in the plan view, the first external connection portion includes
- a plurality of first portions located between the exposed portions in a first direction parallel to one side of the semiconductor layered body, and arrayed in the first direction, with a number of the first portions disposed between adjacent ones of the exposed portions being two or more, and
- a plurality of second portions not located between the exposed portions in the first direction, and arrayed in the first direction, each of the second portions being different in shape or size from each of the first portions, the first external connection portion is provided adjacent to the second external connection portion near an end portion of the second semiconductor layer in the first direction in the plan view, the first external connection portion further includes a fifth portion having a planar shape having an inclined portion inclined with respect to the one side of the semiconductor layered body, on a side facing the second external connection portion, and an interval between the first portions adjacent to each other in the first direction, an interval between the second portions adjacent to each other in the first direction, and an interval between the first portion and the second portion in a second direction orthogonal to the first direction are each 16 μm or more.

17. A light emitting device comprising:
a light emitting element including:
- a semiconductor layered body having a rectangular planar shape and including a first semiconductor layer, a light emitting layer, and a second semiconductor layer in this order, the semiconductor layered body defining a plurality of exposed portions in which the first semiconductor layer is exposed from the second semiconductor layer and the light emitting layer, each of the exposed portions being surrounded by the second semiconductor layer in a plan view;
- an insulating film covering the semiconductor layered body, and defining a plurality of opening portions respectively above the exposed portions;
- a first electrode connected to the exposed portions at the opening portions, a portion of the first electrode being disposed on the second semiconductor layer via the insulating film;
- a second electrode connected to the second semiconductor layer;
- a first external connection portion connected to the first electrode and spaced apart from the exposed portions in the plan view; and
- a second external connection portion connected to the second electrode, wherein in the plan view, the first external connection portion includes
- a plurality of first portions located between the exposed portions in a first direction parallel to one side of the semiconductor layered body, and arrayed in the first direction, with a number of the first portions disposed between adjacent ones of the exposed portions being two or more, and
- a plurality of second portions not located between the exposed portions in the first direction, and arrayed in the first direction, each of the second portions being different in shape or size from each of the first portions;

a substrate including a plurality of wires on an upper surface thereof, the light emitting element being flip-chip mounted on the plurality of wires via the first external connection portion and the second external connection portion; and a cover member containing a light reflective substance, the cover member covering the light emitting element, the first external connection portion, the second external connection portion, and the substrate, wherein the light emitting element includes a first light emitting portion and a second light emitting portion disposed on the substrate, each of the first light emitting portion and the second light emitting portion includes the first external connection portion and the second external connection portion, the plurality of wires include
- a first wire portion connected to the first external connection portion of the first light emitting portion,
- a second wire portion connected to the second external connection portion of the first light emitting portion and the first external connection portion of the second light emitting portion, and
- a third wire portion connected to the second external connection portion of the second light emitting portion, and, an interval between the first portions adjacent to each other in the first direction, an interval between the second portions adjacent to each other in the first direction, and an interval between the first portion and the second portion in a second direction orthogonal to the first direction are each 16 μm or more.

* * * * *